(12) United States Patent
Honma et al.

(10) Patent No.: US 6,667,928 B2
(45) Date of Patent: Dec. 23, 2003

(54) SEMICONDUCTOR DEVICE IN WHICH A CHIP IS SUPPLIED EITHER A FIRST VOLTAGE OR A SECOND VOLTAGE

(75) Inventors: Kazuki Honma, Kodaira (JP); Yoshiki Kawajiri, Musashino (JP); Masashi Wada, Kodaira (JP); Mikio Sugawara, Akita (JP); Hirofumi Sonoyama, Kodaira (JP)

(73) Assignees: Hitachi, Ltd., Tokyo (JP); Akita Electronics Co., Ltd., Akita (JP)

( * ) Notice: Subject to any disclaimer, the term of this patent is extended or adjusted under 35 U.S.C. 154(b) by 0 days.

(21) Appl. No.: 10/132,248

(22) Filed: Apr. 26, 2002

(65) Prior Publication Data

US 2002/0191469 A1 Dec. 19, 2002

(30) Foreign Application Priority Data

Jun. 14, 2001 (JP) ........................................ 2001-180783

(51) Int. Cl.[7] ................................................ G11C 7/00
(52) U.S. Cl. .................. 365/226; 365/189.09; 327/536; 327/537
(58) Field of Search ............................ 365/189.09, 226; 327/530–539

(56) References Cited

U.S. PATENT DOCUMENTS

| | | | | | |
|---|---|---|---|---|---|
| 5,363,335 A | * | 11/1994 | Jungroth et al. | ............ | 365/226 |
| 5,828,892 A | * | 10/1998 | Mizuta | ........................ | 713/300 |
| 6,226,224 B1 | * | 5/2001 | Banba et al. | ................ | 365/226 |
| 6,288,599 B1 | * | 9/2001 | Coddington | ................. | 327/530 |
| 6,434,044 B1 | * | 8/2002 | Gongwer et al. | ....... | 365/185.18 |
| 6,515,507 B1 | * | 2/2003 | Patel et al. | .................... | 326/38 |

* cited by examiner

Primary Examiner—Son Mai
(74) Attorney, Agent, or Firm—Miles & Stockbridge P.C.

(57) ABSTRACT

Disclosed are a semiconductor chip which is uniquely value-added, a semiconductor integrated circuit device which improves the productivity and yield of products and facilitates the production management, and a method of manufacturing of semiconductor integrated circuit devices which enables the improvement of productivity and yield of products and the rational demand-responsive production management. The semiconductor chip includes a common circuit block which is operative at a first voltage and a second voltage that is higher than the first voltage, a first circuit block which is designed to fit the first voltage and operate in unison with the common circuit block, a second circuit block which is designed to fit the second voltage and operate in unison with the common circuit block, and a voltage type setup circuit which activates one of the first and second circuit blocks, with a first identification record indicative of the operability at the first voltage or a second identification record indicative of the operability only at the second voltage being held by the chip.

11 Claims, 25 Drawing Sheets

H18="1" : Vcc=1.8V
H25="1" : Vcc=2.5V
H30="1" : Vcc=3.0V

SEMICONDUCTOR DEVICE IN WHICH A CHIP IS SUPPLIED EITHER A FIRST VOLTAGE OR A SECOND VOLTAGE

BACKGROUND OF THE INVENTION

The present invention relates to a semiconductor chip, a semiconductor integrated circuit device, and a method of manufacturing semiconductor integrated circuit devices, and particularly to a technique useful for the manufacturing of nonvolatile memories of the type of block-erasure.

EE PROM of the type of electrical block erasure is a nonvolatile memory device having a function of erasing at once all memory cells or a block of memory cells formed on a semiconductor chip. The electrically block erasing EE PROM has a memory cell structure which resembles that of ordinary EPSOM. Specifically, a memory cell is formed of an insulated gate field effect transistor having a double-layer structure (will be termed "MOSFET" or simply "transistor"), which stores data virtually in terms of the variation of threshold voltage. The data write operation of the memory cell is identical to EE PROM.

SUMMARY OF THE INVENTION

Semiconductor integrated circuit devices including the above-mentioned nonvolatile memory cells are designed to have individual operating voltages depending on their application systems even though the internal circuit arrangement is common. For example, integrated circuit devices used in personal computer systems operate at such a relatively high voltage as 3.0 V, those used in portable terminal units operate at such an intermediate voltage as 2.5 V, and those mounted on FIC cards operate at such a low voltage as 1.8 V. Due to different types of semiconductor integrated circuit devices, which are identical in internal memory structure but different in operating voltage, the production efficiency is deteriorated.

The inventors of the present invention have contemplated the enhancement of production efficiency of semiconductor integrated circuit devices, which is based on the formation of memory cell arrays and their selection circuits in a common circuit arrangement operative at several operating voltages and the formation of voltage-dependent circuits which fit individual operating voltages, with one circuit being made operative at its operating voltage in the manner of bonding or the like.

The present inventors also have noted that among semiconductor integrated circuits of MOSFET, etc. Designed to fit several operation voltages, the worst condition in achieving the same performance, e.g., operation speed, is the lowest operating voltage, and thought of the expanded application of this idea to the enhancement of the yield of products and the rational demand-responsive production management in consideration of the operating voltage.

Accordingly, it is an object of the present invention to provide a semiconductor chip which is uniquely value-added.

Another object of the present invention is to provide a semiconductor integrated circuit device which improves the productivity and yield of products, and facilitates the production management.

Still another object of the present invention is to provide a method of manufacturing semiconductor integrated circuit devices which enables the enhancement of productivity and yield of products and the rational demand-responsive production management.

These and other objects and novel features of the present invention will be apparent from the following description and accompanying drawings.

Among the affairs of the present invention disclosed in this patent application, a representative is briefed as follows.

The inventive semiconductor chip is arranged to include a common circuit block which is operative at a first voltage and a second voltage that is higher than the first voltage, a first circuit block which is designed to fit the first voltage and operate in unison with the common circuit block, a second circuit block which is designed to fit the second voltage and operate in unison with the common circuit block, and a voltage type setup circuit which activates one of the first and second circuit blocks, with a first identification record indicative of the operability at the first voltage or a second identification record indicative of the operability only at the second voltage being held by the chip.

Another representative disclosed in this patent application is briefed as follows.

The inventive semiconductor integrated circuit device is arranged in a semiconductor chip, which include a common circuit block which is operative at a first voltage and a second voltage that is higher than the first voltage, a first circuit block which is designed to fit the first voltage and operate in unison with the common circuit block, a second circuit block which is designed to fit the second voltage and operate in unison with the common circuit block, and a voltage type setup circuit which activates one of first and second circuit blocks, the voltage type setup circuit selecting the first or second circuit block if the chip is operative at the first voltage or selecting the second circuit block if the chip is operative only at the second voltage.

Still another representative disclosed in this patent application is briefed as follows.

The inventive method of manufacturing semiconductor integrated circuit devices includes the steps of forming semiconductor chips on a wafer, each chip including a common circuit block which is operative at a first voltage and a second voltage that is higher than the first voltage, a first circuit block which is designed to fit the first voltage and operate in unison with the common circuit block, a second circuit block which is designed to fit the second voltage and operate in unison with the common circuit block, and a voltage type setup circuit which activates one of first and second circuit blocks, testing the operability of each chip at the first and second voltages during the probing test process, setting up the first voltage to the voltage type setup circuit in the assembly process for a chip which is operative at the first voltage, and setting up the second voltage to the voltage type setup circuit during the assembly process for a chip which is operative at the first voltage and for a chip which is operative only at the second voltage in accordance with the test result and the demand of products.

DESCRIPTION OF THE PREFERRED EMBODIMENTS

Figure 1:
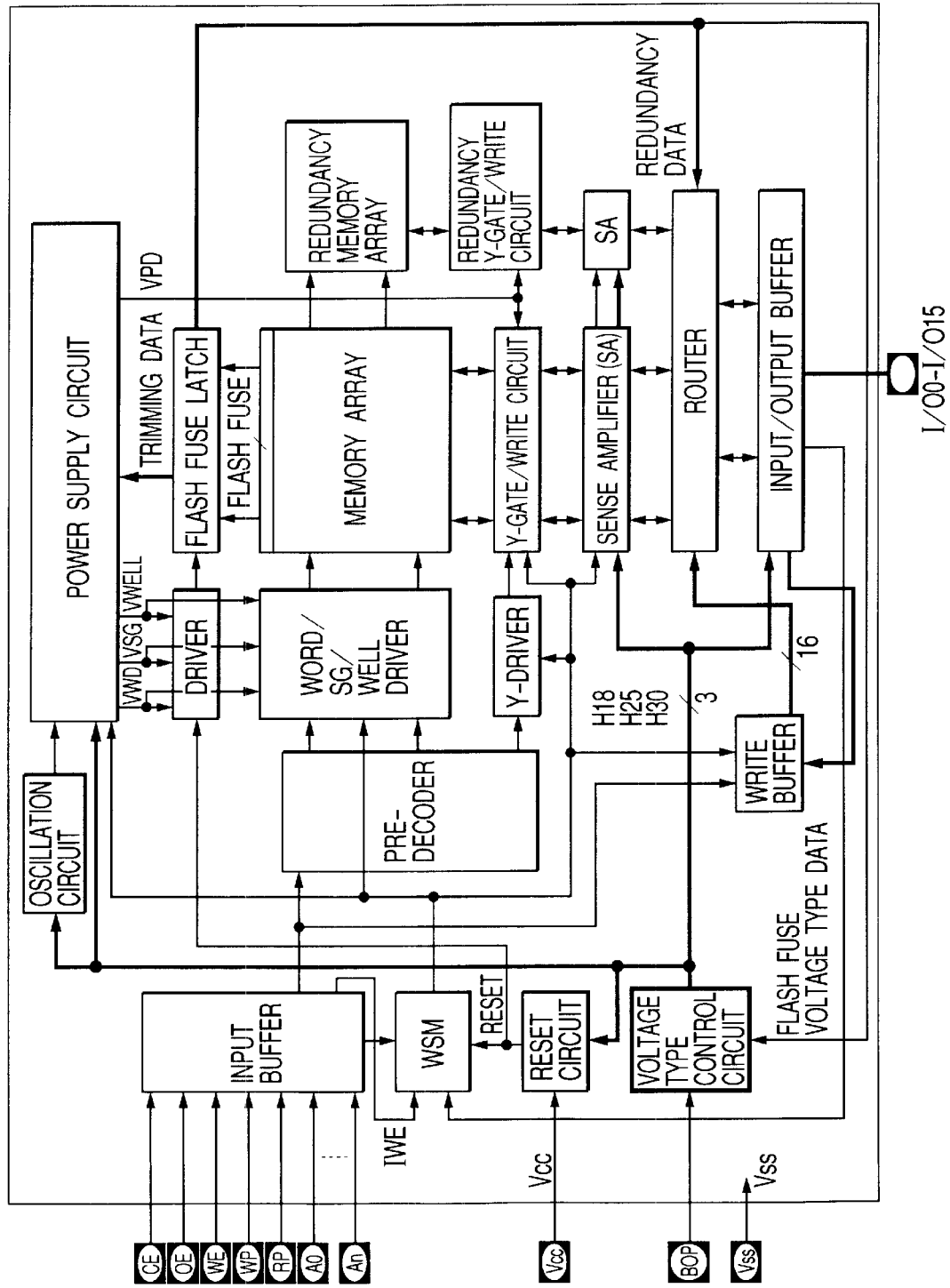
FIG. 1 is a block diagram showing the overall arrangement of the nonvolatile memory based on an embodiment of this invention.

FIG. 1 shows by block diagram the overall arrangement of the nonvolatile memory based on an embodiment of this invention. The circuit blocks shown in the figure are formed by the known semiconductor integrated circuit fabrication process on a semiconductor substrate of monocrystalline silicon for example.

The memory array is nonvolatile memory cells, each having a control gate and floating gate in a stacked gate structure, arranged on the intersections of the matrix of word lines and data lines. Each memory cell has its control gate electrode, drain electrode and source electrode connected to a word line, data line and source line, respectively. The write operation of memory cell is based on the tunnel current flowing through the thin oxide film, or based on hot electrons created by the current flowing between the source and drain, although this affair is not compulsory. The erase operation of memory cell is based on the tunnel current. The redundancy memory array includes spare memory cells, spare word lines and spare bit lines (i.e., spare blocks), which can take the place of defective memory cells, defective word lines and defective bit lines of the memory array.

The redundancy memory array has its own column selection circuit including a redundancy y-gate/write circuit and sense amplifier SA. The router operates in response to a faulty address to switch the write circuit to the redundancy write circuit for data writing, or switch the sense amplifier to the redundancy sense amplifier for data readout, thereby replacing defective memory cells in the memory cell with spare memory cells in the redundancy memory array.

The input buffer includes a control buffer for the control signals CRE, OEM, WE, WP and TRP, and an address buffer having a latch function for the address signal Ac-An. The address signal latched by the address buffer is put into the pre-decoder, which then produces an x-wise decode signal and y-wise decode signal. The x-wise decode signal is put into the word line selection circuit, i.e., word/PG (select gate)/well drivers, which then implements the word line select or non-select operation depending on the operation mode of writing, reading or erasing. The y-wise decode signal is put into the y driver, which then operates on the y-gate write circuit to implement the bit line select operation depending on the operation mode of writing or reading.

The write buffer having a latch function latches at once multiple write-in data signals received on the external terminals I/O0–I/O15. So that it can hold data of one word line for example. In the case of 16-bit data input/output, it can latch 128 sets of write-in data. Accordingly, it can hold 2048 bits of write-in data, enabling the simultaneous writing to 2048 memory cells connected to one word line. The read-out data signal from the memory array is sensed by the sense amplifier (SA), which then releases the output signal to the external terminals I/O0 through I/O15. Via the input/output buffer, which also delivers the output signal to the automatic control circuit (WAS) for verification.

The write/read/erase operations are controlled based on signals WE and CRE of the control buffer included in the input buffer. For example, when the signals WE and CRE are turned to the low level, input command data placed on the external terminals I/O0–I/O15. Is entered to the automatic control circuit (WAS) via the input/output buffer. The automatic control circuit (WAS) decodes the command data to determine the write, read or erase mode. The memory is generally brought to the read mode immediately after it is turned on or when it is reset from the outside by reset signal RP. The signal WP is used to inhibit the write operation. These external signals OE, WE, CE, WP and RP are all low-active signals, although this affair is not compulsory.

The automatic control circuit (WAS: Write State Machine) is a simple microprocessor, which decodes the input command data to produce a operation sequence control signal of the write mode, read mode or erase mode in accordance with the stored program.

The automatic control circuit (WSM) stores the operation mode and operation sequence, which can be read out via the input/output buffer, so that the host system such as a microcomputer controls the memory by checking the memory's internal state based on data poling or the like. Specifically, for the erase operation which expends as long as 0.5 to 1 second for example, the host microcomputer issues an erase command and address to the memory and thereafter go to other data processing with a peripheral unit in bus connection. On detecting the end of erasure based on poling, the microcomputer resumes the access to the memory for writing or reading.

The reset circuit produces a reset signal from the reset signal TRP and the detection result of power voltage Vcc. The power voltage detection is to detect the turn-on of power and also detect the fall of power voltage below the prescribed level, in which case the write and erase operations are suspended to prevent a faulty operation resulting from an insufficient voltage level. The power supply circuit produces a word line voltage VWD for writing, select gate voltage VSG, well voltage VWEL, write bit line voltage VPD, word line selecting voltage for write/erase verification, and erasure inhibiting voltage. The power supply circuit has charge pump circuits, by which it produces various voltages including voltages higher than the supply voltage and a negative voltage based on output pulses of the oscillation circuit. This pulse signal is also used for the clock signal of the automatic control circuit (WSM).

In regard to the range of erasure, there can be word line (sector) erasing, word lines (block) erasing, and memory mat erasing, although this affair is not compulsory. The number of word lines selected for erasing is variable depending on the range of erasure. At the erasure verification, the word line address is switched so that multiple word lines corresponding to the range of erasure are switched sequentially.

The voltage type control circuit produces H signals, e.g., H18 for 1.8 V, H25 for 2.5 V and H30 for 3.0 V, in accordance with the signal of bonding pad BOP and voltage type data set in the flash fuse, thereby establishing power voltages Vcc for individual circuit clocks. The memory array circuit and associated selection circuit are designed to operate consistently under any of these power voltages Vcc, and other voltage-dependent circuits, e.g., the reset circuit, power supply circuit, oscillation circuit, sense amplifier, and input/output buffer, are given the voltage type switch signals H18, H20 and H30 so that the circuits fit the individual power voltages.

The flash memory of this embodiment operates on the voltage type control circuit to produce the voltage type switch signals H18, H20 and H30 based on the bonding/fuse option. The voltage-dependent circuits respond to the voltage type switch signals to select circuit parameters or switch the whole circuit so that they operate stably under the individual power voltages, e.g.,1.8 V, 2.5 V and 3.0 V. The voltage type switch signals H18, H20 and H30 may be produced based on the provision of two bonding pads, instead of the combination of a bonding pad (BOP) and flash fuse adopted in this embodiment.

In this embodiment, a flash fuse area is provided at the edge of memory array, and part of the flash memory is used for the fuse for memorizing defective addresses. The flash fuse section has an associated driver and latch circuit for writing, reading and erasing the fuse. This arrangement of simply memorizing redundancy addresses in the nonvolatile memory, however, cannot function if the flash fuse fails. For coping with this matter, as will be explained later, the inventive semiconductor integrated circuit is devised so as to be capable of memorizing defective addresses and voltage type data inherent to this invention normally regardless of the presence of defective memory cells which form the flash fuse.

Figure 2:
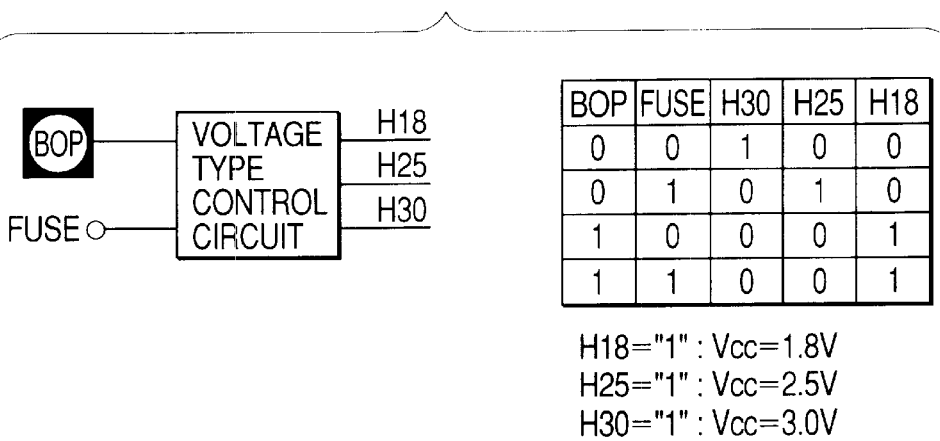
FIG. 2 is a block diagram showing an embodiment of the voltage type control circuit used in the semiconductor integrated circuit device of this invention.

FIG. 2 shows by block diagram an embodiment of the voltage type control circuit used in the semiconductor integrated circuit device of this invention. The voltage type control circuit produces three voltage type switch signals H18, H25 and H30 based on the voltage applied to the bonding pad (BOP) and the signal from the fuse (Fuse).

Specifically, a low-level (logical "0") bonding pad voltage and a low-level fuse voltage in combination produce a high-level (logical "1") switch signal H30 and other low-level switch signals. A low-level bonding pad voltage and a high-level fuse voltage in combination produce a high-level switch signal H25 and other low-level switch signals. A high-level bonding pad voltage and a fuse voltage at any level in combination produce a high-level switch signal H18 and other low-level switch signals.

These voltage type switch signals H18, H25 and H30 of high level (logical "1") cause the receiving circuit to have a circuit operation or circuit selection that fits the power voltages Vcc 1.8 V, 2.5 V and 3.0 V, respectively.

Figure 3:
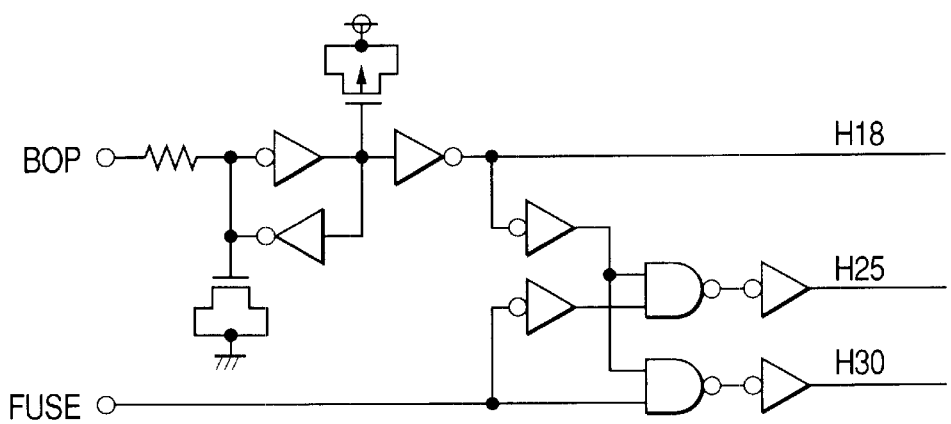
FIG. 3 is a schematic circuit diagram of an embodiment of the voltage type control circuit shown in FIG. 2.

FIG. 3 shows an embodiment of the voltage type control circuit shown in FIG. 2. The bonding pad (BOP) is connected through a resistor to one node of two antiparallel-connected logic inverters which form a latch circuit. This node is connected to the ground voltage Vss through a load which is the gate capacitance of an n-channel MOSFET. The latch circuit has its another node connected to the power voltage through a load which is the gate capacitance of a p-channel MOSFET. Accordingly, when the bonding pad (BOP) is left open, the latch circuit settles to have a low level on the one node and a high level on the other node immediately after power is turned on.

When the power voltage Vcc is applied to the bonding pad (BOP) by bonding, it is conducted as high-level signal through the resistor to the one node, causing the latch circuit to reverse the latched state, i.e., having a high level on the one node and a low level on the other node. When the ground voltage Vss is applied to the bonding pad (BOP) by bonding, it is conducted as low-level signal through the resistor to the one node, causing the latch circuit to have the same state as the case of open bonding pad (BOP). Accordingly, the circuit arrangement of this embodiment requires only wire bonding for the application of power voltage Vcc to the bonding pad (BOP) for the setup of operation at 1.8 V and allows the omission of Vss application for other voltage setups.

The voltage type switch signal H18 is high in response to the application of power voltage Vcc to the bonding pad (BOP) by bonding, and it stays low in the absence of voltage application. A low-level switch signal H18 is used by the following logic circuit section to produce a high-level switch signal H25 or H30 depending on the logical level of the flash fuse (FUSE). The reason for the switching of voltage types of 1.8 V, 2.5 V and 3.0 V on the bonding pad (BOP) is that the power-on reset circuit needs to be altered for its response at the rise of power voltage Vcc and the flash fuse signal which is read out by the RESET signal from the power-on reset circuit cannot be used, as will be described in detail later.

Figure 4:
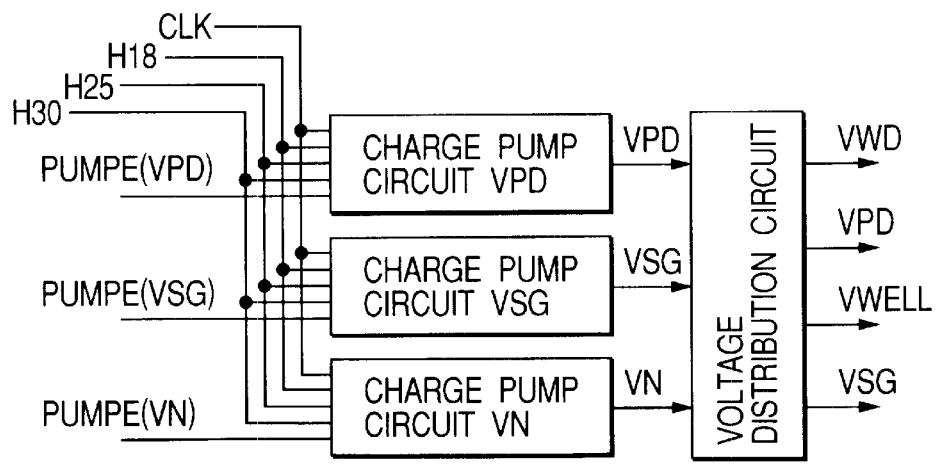
FIG. 4 is a block diagram showing an embodiment of the power supply circuit used in the semiconductor integrated circuit device of this invention.

FIG. 4 shows by block diagram an embodiment of the power supply circuit used in the semiconductor integrated circuit device of this invention. The power supply circuit includes three kinds of charge pump circuit. Among three output voltages, VPDP is supplied to the bit lines for the memory write operation, VSGP is used for the selecting operation of the select gate which connects the sub bit lines in connection with the memory cells to the main bit lines in the write operation and for the well supply in the erase operation, and VN is a negative voltage used for the erase operation.

The three charge pump circuits receive individual control signals PUMPE(VDP), PUMPE(VSG) and PUMPE(VN) which activate or deactivate their operation. The charge pump circuits also receive commonly the clock signal CLK and voltage type switch signals H18, H25 and H30. The output voltages VPDP, VSGP and VN of the charge pump circuits are conducted to a voltage distribution circuit, which then releases the voltages VWD, VPD, VWELL and VSG.

The charge pump circuits produce the voltages VPD, VSG and VN virtually consistently from any power voltage Vcc among 1.8 V, 2.5 V and 3.0 V by fitting the Vcc in response to the voltage type switch signals H18, H25 and H30 In consequence, the memory is operative for data writing, reading and erasing consistently under any of three kinds of power voltages.

Figure 5:
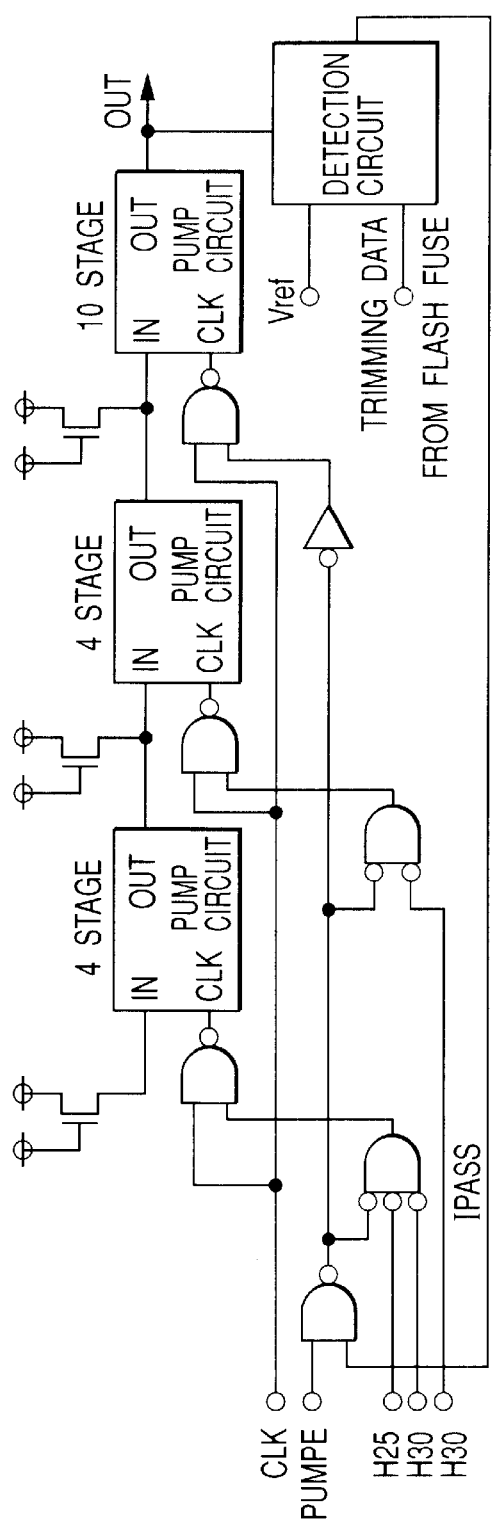
FIG. 5 is a schematic circuit diagram of an embodiment of the charge pump circuit shown in FIG. 4.

FIG. 5 shows an embodiment of the charge pump circuit shown in FIG. 4. The circuit is made up of two 4-stage pump circuits and a 10-stage pump circuit in tandem connection. Each pump circuit is supplied on its input terminal IN the power voltage Vcc through a MOSFET which is connected to function as a diode. The leading circuit puts its pump output to the input IN of the middle circuit, which puts the pump output to the input IN of the last circuit.

These three pump circuits are operated selectively to match with the power voltage Vcc. Specifically, when the power voltage Vcc is 1.8 V, all pump circuits are operated, or when Vcc is 2.5 V, the middle and last pump circuits are operated, or when Vcc is 3.0 V, only the last pump circuit is operated.

The pump circuits operate in response to the clock signal CLK received on their clock terminal CLK through logic gates. The last pump circuit, which is operated at any power voltage, receives through an inverter the output of a logic gate having inputs of the pump enable signal PUMPE and the output signal of a detection circuit which will be explained later.

The middle pump circuit is operated when the voltage type switch signal H30 is low and the output of the logic gate with the PUMPE input is low, i.e., it operates when the power voltage Vcc is either 1.8 V or 2.5 V. The leading pump circuit is operated when the voltage type switch signals H25 and H30 are low and the output of the logic gate with the PUMPE input is low, i.e., it operates only when the power voltage Vcc is 1.8 V.

As a total charge pump circuit, it is controlled in accordance with the combination of the voltage type switch signals H25 and H30 so that it operates in 18 stages when the power voltage Vcc is 1.8 V, or in 14 stages when Vcc is 2.5 V, or in ten stages when Vcc is 3.0 V. In consequence, the optimal pump drive performance (e.g. , 12 V, 150 $\mu$A) is achieved by adapting to any power voltage among 1.8 V, 2.5 V and 3.0 V.

The above-mentioned detection circuit implements the constant output voltage control by halting the pump operation when the output voltage, after undergoing voltage division, becomes higher than the reference voltage Vref. The flash fuse produces trimming data, which is set to the detection circuit so that the intended output voltage is released by offsetting the parts disparity of the charge pump circuits and detection circuit.

Figure 6:
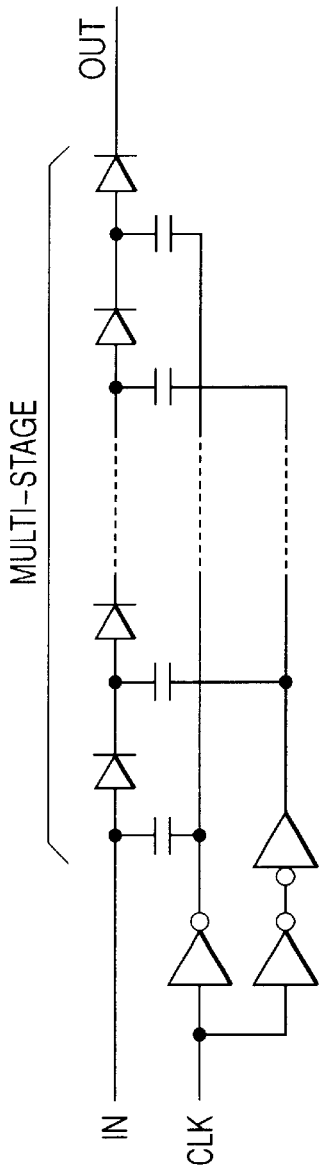
FIG. 6 is a schematic circuit diagram of an embodiment of the pump circuit shown in FIG. 5.

FIG. 6 shows an embodiment of the pump circuit shown in FIG. 5. This pump circuit is a serial connection of diodes, with their nodes supplied through individual capacitors with the clock signal and its inverted version alternately so that the capacitor holding voltage and the high-level clock signal voltage are summed cumulatively, thereby implementing a voltage step-up operation. The diodes can be poly-diodes formed by implanting p-type and n-type impurities on a silicon substrate, or MOSFETs in diode connection, or the gate capacitance of MOSFETs.

Figure 7:
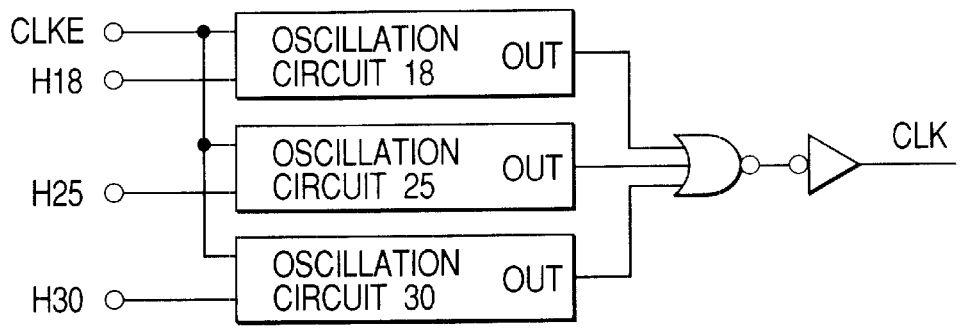
FIG. 7 is a block diagram showing an embodiment of the oscillation circuit used in the semiconductor integrated circuit device of this invention.

FIG. 7 shows by block diagram an embodiment of the oscillation circuit used in the semiconductor integrated circuit device of this invention. This oscillation circuit produces the clock signal used for the automatic control circuit (WAS) and for the charge pumping operation. The stability of clock frequency is not so severe for producing a virtually constant output voltage of the charge pump circuit, whereas the fluctuation of clock frequency in response to the variation of power voltage Vcc is serious for the automatic control circuit (WAS) which works as a microprocessor and implements the timing control for data writing and erasing.

On this account, the oscillation circuit is made up of three oscillation circuits 18,25 and 30 in correspondence to the power voltages Vcc of 1.8 V, 2.5 V and 3.0 V. These oscillation circuits 18, 25 and 30 are activated or deactivated by the voltage type switch signals H18, H25 and H30. The oscillation circuits 18,25 and 30 have their output signals OUT merged and released through a NOR gate and a following inverter. One of the three oscillation circuits 18,25 and 30 is activated in response to the combination of the signals H18, H25 and H30, and the resulting clock signal CLK has a virtually constant frequency at all power voltages Vcc of 1.8 V, 2.5 V and 3.0 V.

Figure 8:
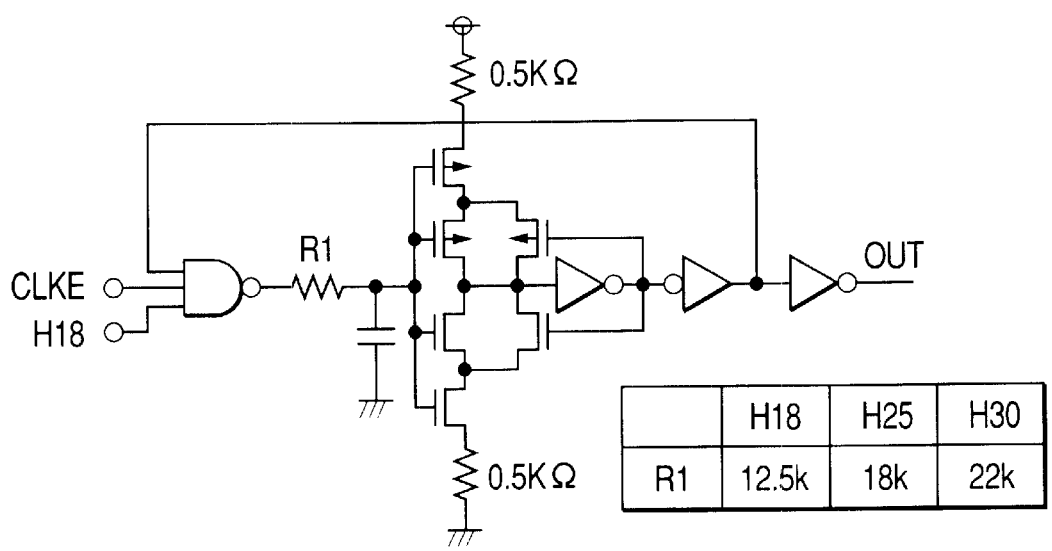
FIG. 8 is a schematic circuit diagram of an embodiment of the oscillation circuit shown in FIG. 7.

FIG. 8 shows an embodiment of the oscillation circuit shown in FIG. 7. The circuit arrangement is common to all of the oscillation circuits 18,25 and 30 except for the oscillation frequency determining resistor R1, which is 12.5 K$\Omega$, 18 K$\Omega$ and 22 K$\Omega$ for the circuits 18,25 and 30 corresponding to the signals H18, H25 and H30, respectively.

The oscillation circuit is basically a ring oscillator which is made up by a loop connection of a NAND gate having control inputs of the clock enable signal CLKE and voltage type switch signal H18 (or H25 or H30), a time constant circuit of a resistor R1 and capacitor, an amplifying circuit, and an inverter.

The amplifying circuit includes an input circuit of two p-channel MOSFETs and two n-channel MOSFETs in serial connection and another p-channel MOSFET and n-channel MOSFET which are connected in parallel to the p-type and n-type output MOSFETs of the input circuit to receive the output of the input circuit following the inversion by an inverter and feed their outputs back to the input circuit. Based on these positive feedback paths, the amplifying circuit makes a sharp transition from low level to high level, and vice versa.

The oscillation circuit shown in the figure has its NAND gate output fixed to the high level upon receive either a low-level clock enable signal CLKE or a low-level voltage type switch signal H18, and it halts the oscillating operation. At the same time, there is theoretically no d.c. current flow in the ring oscillator stages, and accordingly the power consumption of the circuit is small. Despite the presence of three oscillation circuits, only one circuit operates at a time depending on the power voltage for the write and erase operations of the flash memory and all circuits have no power consumption in the data holding state, and accordingly this configuration does not increase the power consumption.

Figure 9:
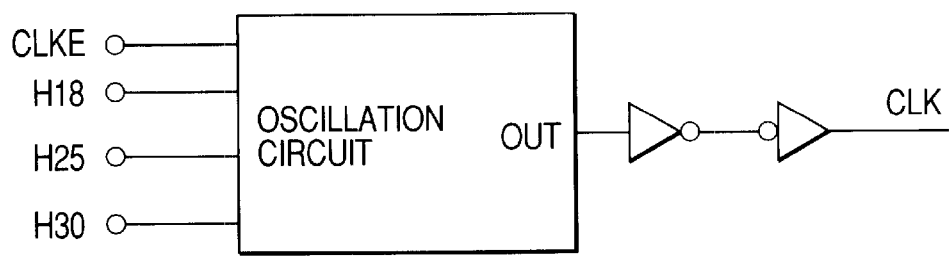
FIG. 9 is a block diagram showing another embodiment of the oscillation circuit shown in FIG. 7.

FIG. 9 shows another embodiment of the oscillation circuit shown in FIG. 7. This single oscillation circuit is designed to produce the clock signal CLK of a virtually constant frequency at any power voltage Vcc among 1.8 V, 2.5 V and 3.0 V.

Figure 10:
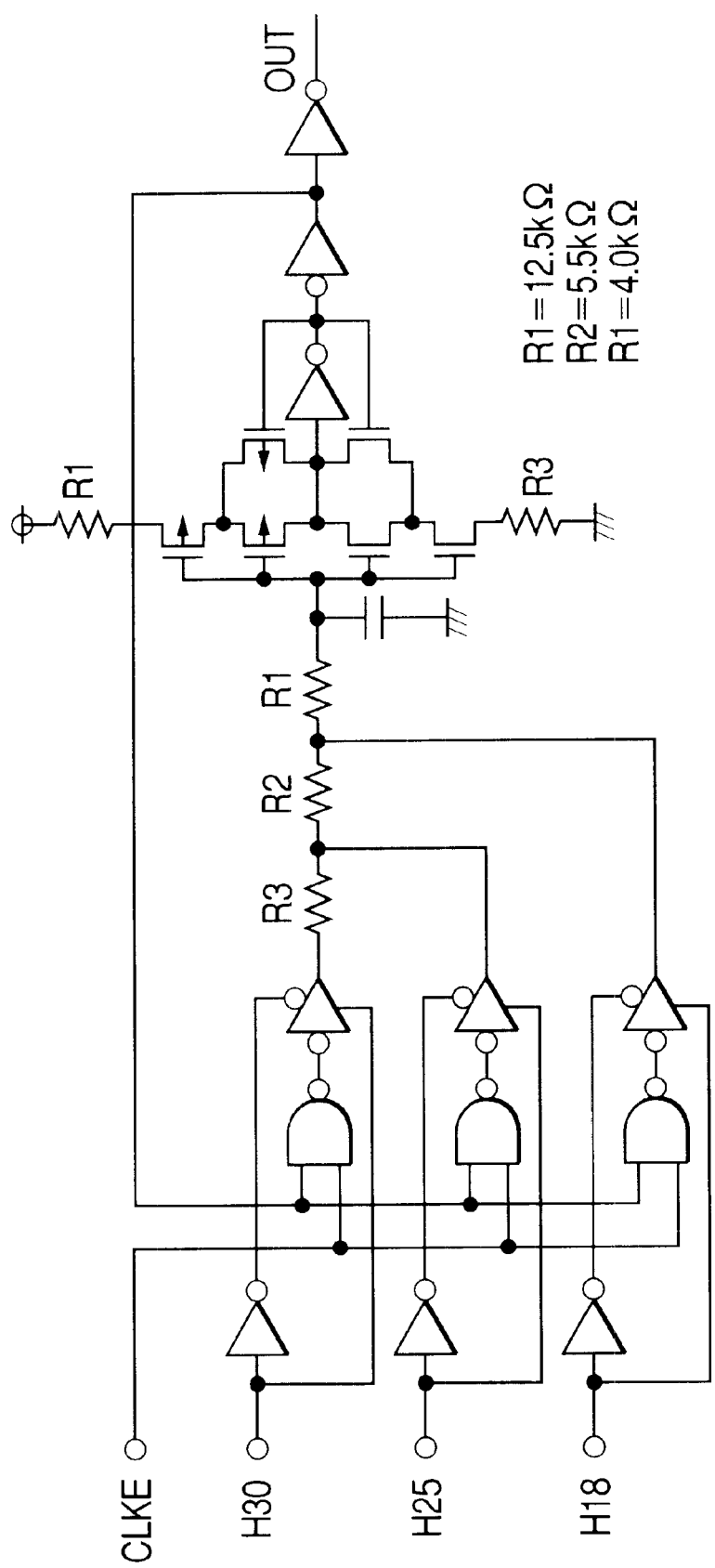
FIG. 10 is a schematic circuit diagram of an embodiment of the oscillation circuit shown in FIG. 9.

FIG. 10 shows an embodiment of the oscillation circuit shown in FIG. 9. This circuit has three input gate control signal producing circuits and three input gate circuits in correspondence to the voltage type switch signals H18, H25 and H30. The input gate circuit for the switch signal H30 has its output signal conducted to a capacitor and amplifying circuit similar to those of the previous embodiment through a serial connection of resistors R3, R2 and R1. The input gate circuit for the switch signal H25 has its output signal put to the node of the resistors R3 and R2. The input gate circuit for the switch signal H18 has its output signal put to the node of the resistors R2 and R1.

The ring oscillator operating at the highest power voltage Vcc of 3.0 V has the shortest signal delay throughout the stages, resulting in a higher output frequency. On this account, all of three resistors R3, R2 and R1 in series are used so that the larger time constant extends the signal delay for compensation. By the same reason, the ring oscillator operating at the mid power voltage Vcc of 2.5 V or lowest power voltage Vcc of 1.8 V uses the series resistors R2 and R1 or only resistor R1, respectively, thereby having an intermediate or smallest time constant for the signal delay compensation.

The p-channel MOSFETs and n-channel MOSFETs of the amplifying circuit have their values of source resistors R1 and R3 determined in correspondence to the series resistors R1, R2 and R3. For example, the resistors R1, R2 and R3 have resistance values of 1.2 KΩ, 5.5 KΩ and 4.0 KΩ, respectively. Based on the switching of the resistance value which determines the oscillation frequency in response to the voltage type switch signals H18, H25 and H30, an accurate oscillation frequency can be obtained at all power voltages.

During the operation, unselected input gate circuits have their outputs brought to the high impedance state by use of clocked inverters at the outputs of input gate circuits so that these input gate circuits do not affect the ring oscillator operation with the selected input gate circuit.

Figure 11:
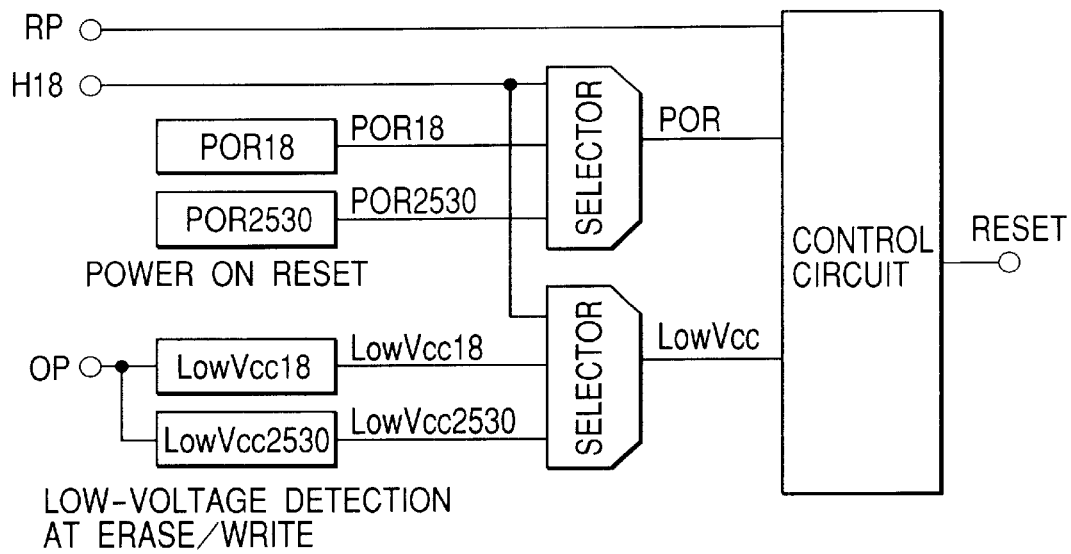
FIG. 11 is a block diagram showing an embodiment of the reset circuit used in the semiconductor integrated circuit device of this invention.

FIG. 11 shows by block diagram an embodiment of the reset circuit used in the semiconductor integrated circuit device of this invention. The reset circuit produces a reset signal RESET which resets the circuit blocks to cease the memory operation at the turn-on of power and when the power voltage falls too low during the data write or erase operation. The reset signal RESET goes high when either the power-on reset signal POR or low-voltage detect signal LowVcc becomes high in the presence of a low-level signal on the external input pin TRP.

The reset circuit of this embodiment includes a power-on reset circuit POR18 for power voltage Vcc of 1.8 V and another power-on reset circuit POR2530 for power voltages Vcc of 2.5 V and 3.0 V. The circuit further includes a low-voltage detect circuit LowVcc18 for power voltage Vcc of 1.8 V and another low-voltage detect circuit LowVcc2530 for power voltages Vcc of 2.5 V and 3.0 V.

These two sets of circuits POR18 and POR2530, and LowVcc18 and LowVcc2530 are followed at their outputs by selectors. These two selectors are controlled by the voltage type switch signal H18 to conduct a power-on reset signal POR and low-voltage detect signal LowVcc from one of two circuit pairs to the control circuit.

Figure 12A:
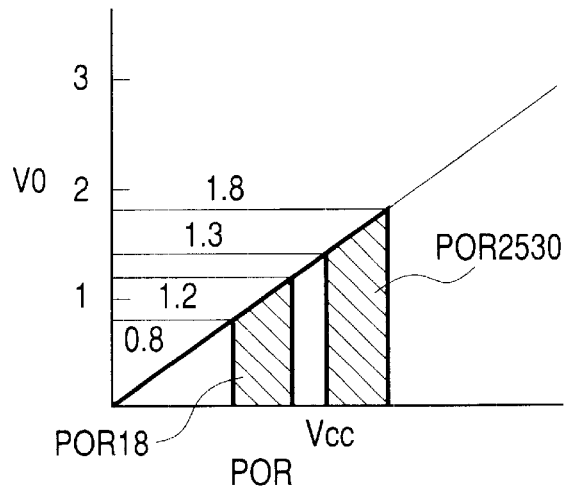
FIGS. 12A and 12B are voltage characteristic graphs used to explain the operation of the power-on reset circuit and low-voltage detection circuit shown in FIG. 11.
Figure 12B:
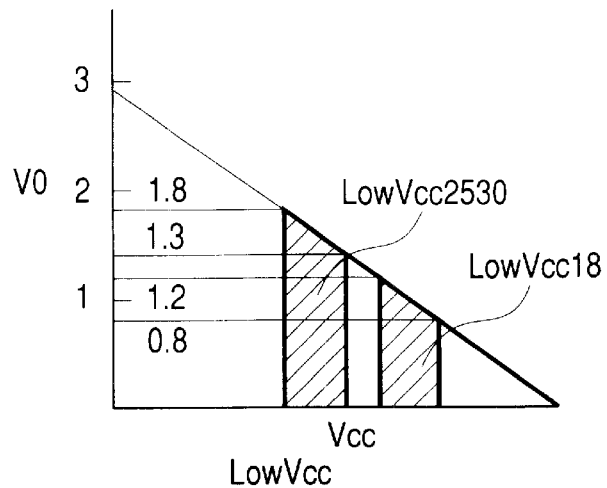

FIGS. 12A and 12B show by graph the voltage characteristics of the power-on reset circuits and low-voltage detect circuits, respectively, shown in FIG. 11. On the graph of FIG. 12A, the power-on reset circuit POR18 releases the power-on reset signal POR in response to a power voltage V0 ranging from 0.8 to 1.2 V as shown by hatching. The voltage range is derived from the disparity of circuit characteristics. The power-on reset circuit POR2530 releases the power-on reset signal POR in response to a power voltage V0 ranging from 1.3 to 1.8 V as shown by hatching. Consequently, the power-on reset signal POR can be produced at any power voltage Vcc among 1.8 V, 2.5 V and 3.0 V.

On the graph of FIG. 12B, the low-voltage detect circuit LowVcc18 releases the low-voltage detect signal LowVcc in response to a power voltage V0 ranging from 1.2 to 0.8 V as shown by hatching. The voltage range is derived from the disparity of circuit characteristics. The low-voltage detect circuit LowVcc2530 releases the low-voltage detect signal LowVcc in response to a power voltage V0 ranging from 1.8 to 1.3 V as shown by hatching. Based on the signal LowVcc, imperfect data writing or erasure can be prevented at any power voltage Vcc among 1.8 V, 2.5 V and 3.0 V.

Figure 13:
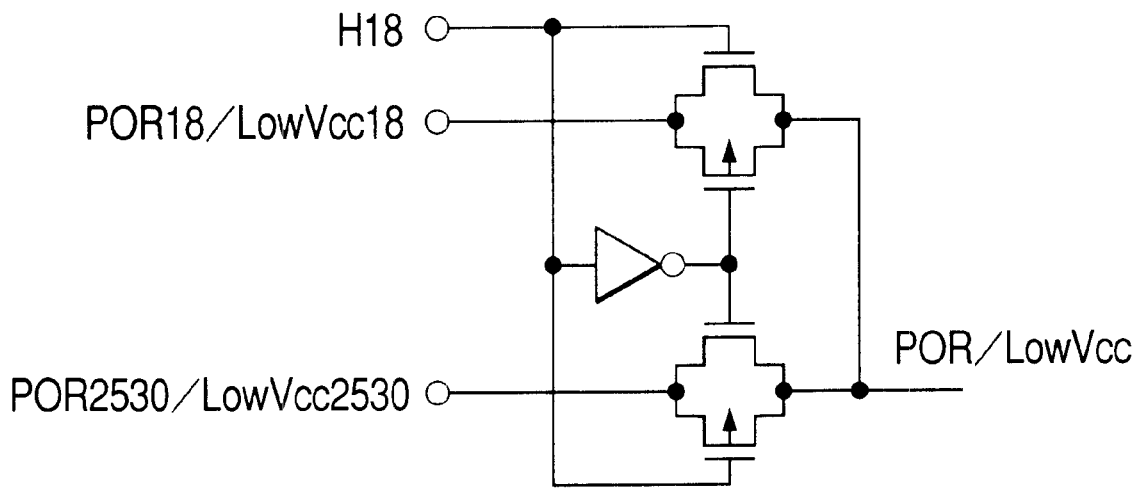
FIG. 13 is a schematic circuit diagram of an embodiment of the selector shown in FIG. 11.

FIG. 13 shows an embodiment of the selector shown in FIG. 11. The selector is a pair of CMOS switch circuits each formed of a p-channel and n-channel MOSFETs connected in parallel, and it is controlled by the voltage type switch signal H18. One selector is used to select one of the power-on reset signals POR18 and POR2530, and another selector is used to select one of the low-voltage detect signal LowVcc18 and LowVcc2530. Consequently, the signals POR and LowVcc relevant to Vcc of 1.8 V or Vcc of 2.5 V or 3.0 V are released.

Figure 14:
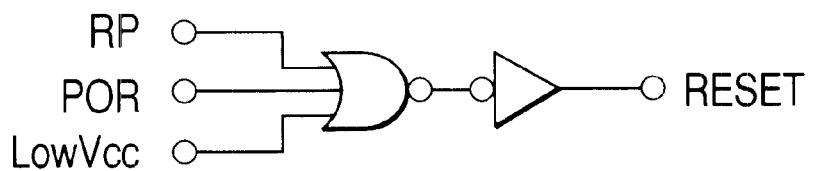
FIG. 14 is a schematic circuit diagram of an embodiment of the control circuit shown in FIG. 11.

FIG. 14 shows an embodiment of the control circuit shown in FIG. 11. The control circuit is a logical product gate circuit formed of a NOR gate and an inverter. The circuit produces the reset signal RESET when at least one of the external reset signal RP, power-on reset signals POR and low-voltage detect signal LowVcc goes high (logical "1").

Figure 15:
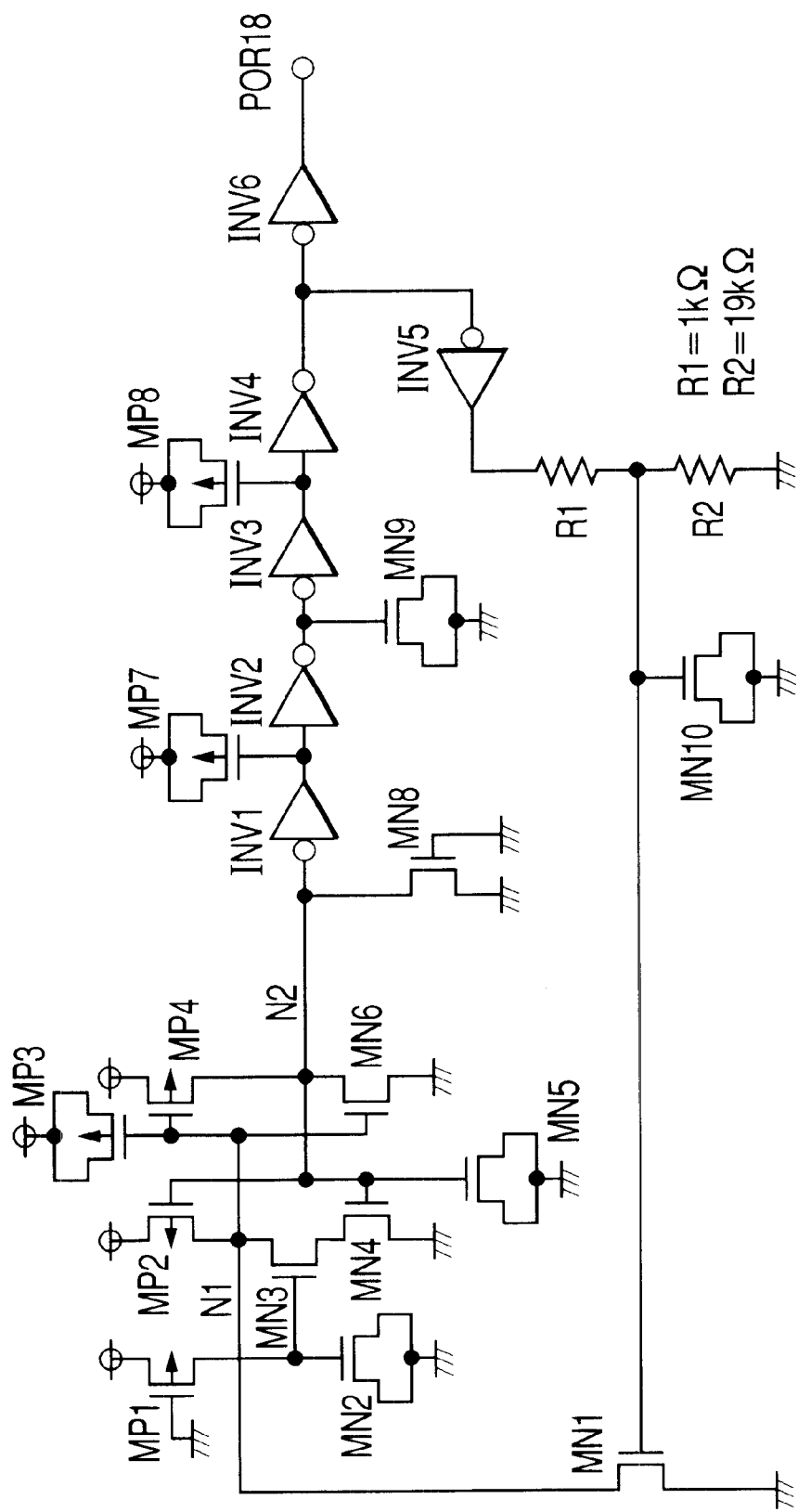
FIG. 15 is a schematic circuit diagram of an embodiment of the power-on reset circuit shown in FIG. 11.

FIG. 15 shows an embodiment of the power-on reset circuit shown in FIG. 11. This circuit is for Vcc of 1.8 V. A latch circuit formed of p-channel MOSFETs MP2 and MP4 and n-channel MOSFETs MN3, MN4 and MN5 is settled to have a high and low levels on its nodes N1 and N2, respectively, by diodes of a p-channel MOSFET MP3 and n-channel MOSFET MN5 at the turn-on of power.

The signal on the node N2 is conducted by being delayed by five (odd number of) retarding inverters INV1–INV5, divided in voltage at the output of inverter INV5 by resistors R1 and R2, and put to the gate of an n-channel MOSFET MN1. For the stable initializing operation at the turn-on of power, the inverters INV1 and INV3 have their outputs, which will go high at power-on, connected by diodes of MOSFETs MP7 and MP8 to the power voltage, and the inverter INV2 has its output, which will go low at power-on, connected by a diode of MOSFET MP9 to the ground voltage.

In operation, when the voltage divided on the node of resistors R1 and R2 and fed to the gate of the MOSFET MN1 becomes higher than the threshold voltage of MN1, this MOSFET becomes conductive, causing the high-level node N1 at power-on to be pulled to the low level. Consequently, the latch circuit reverses the state to present the characteristics of power-on reset circuit shown in FIG. 12A. The resulting power-on reset signal POR is active after power is turned on until the MOSFET MN1 becomes conductive.

Figure 16:
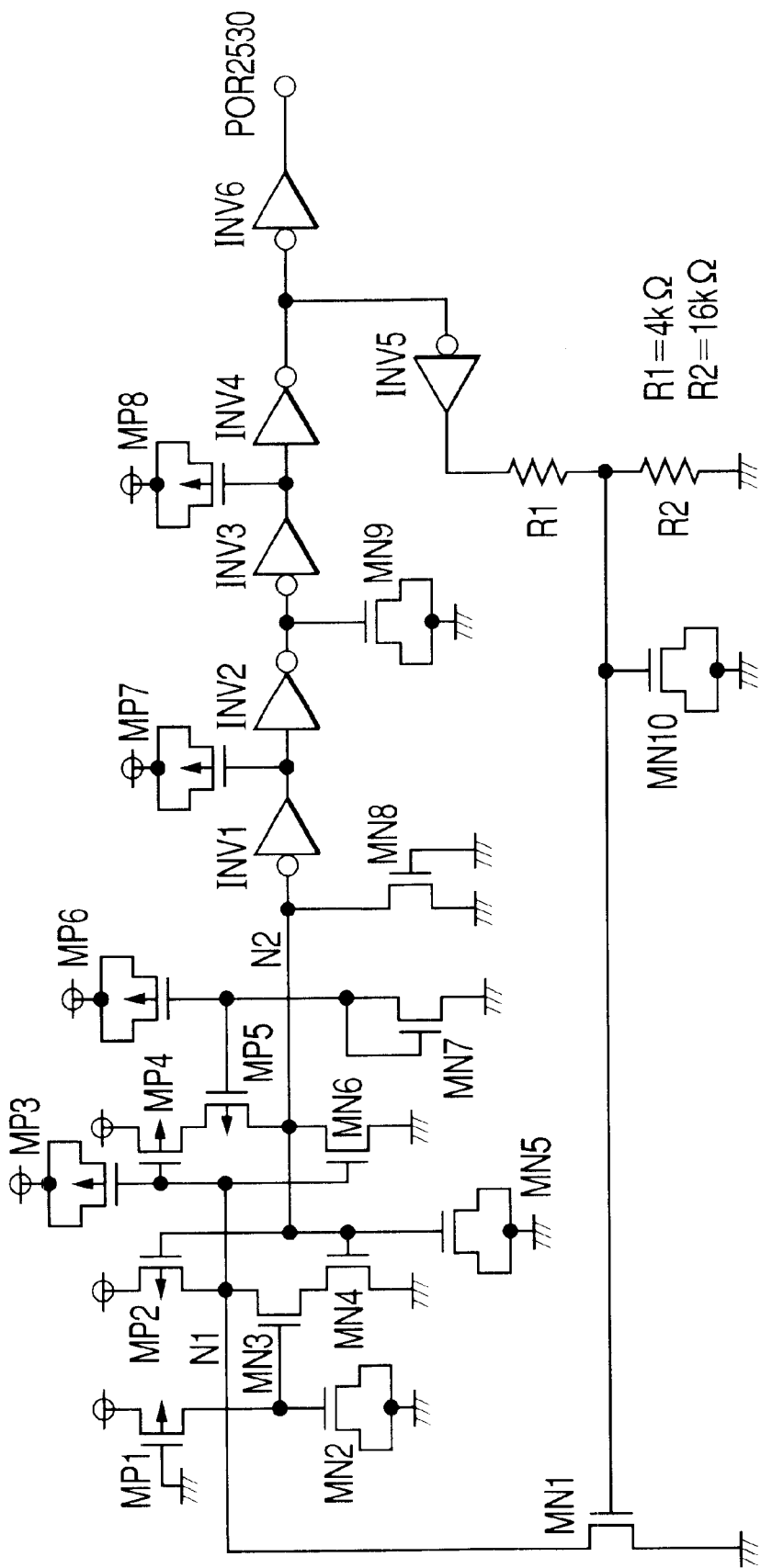
FIG. 16 is a schematic circuit diagram of an embodiment of the other power-on reset circuit shown in FIG. 11.

FIG. 16 shows an embodiment of the other power-on reset circuit shown in FIG. 11. This circuit is for Vcc of 2.5 V and 3.0 V. The circuit arrangement is substantially the same as the preceding one shown in FIG. 15, with a difference being the resistance values of R1 and R2 to have the voltage division ratio for Vccof 2.5 V and 3.0 V. The circuit of FIG. 15 has its R1-to-R2 ratio set to be 1:19, whereas that of the circuit of FIG. 16 is set to be 1:4, specifically such large resistance values as 4 KΩ and 16 KΩ, respectively, are selected for the reduction of d.c. current.

Figure 17:
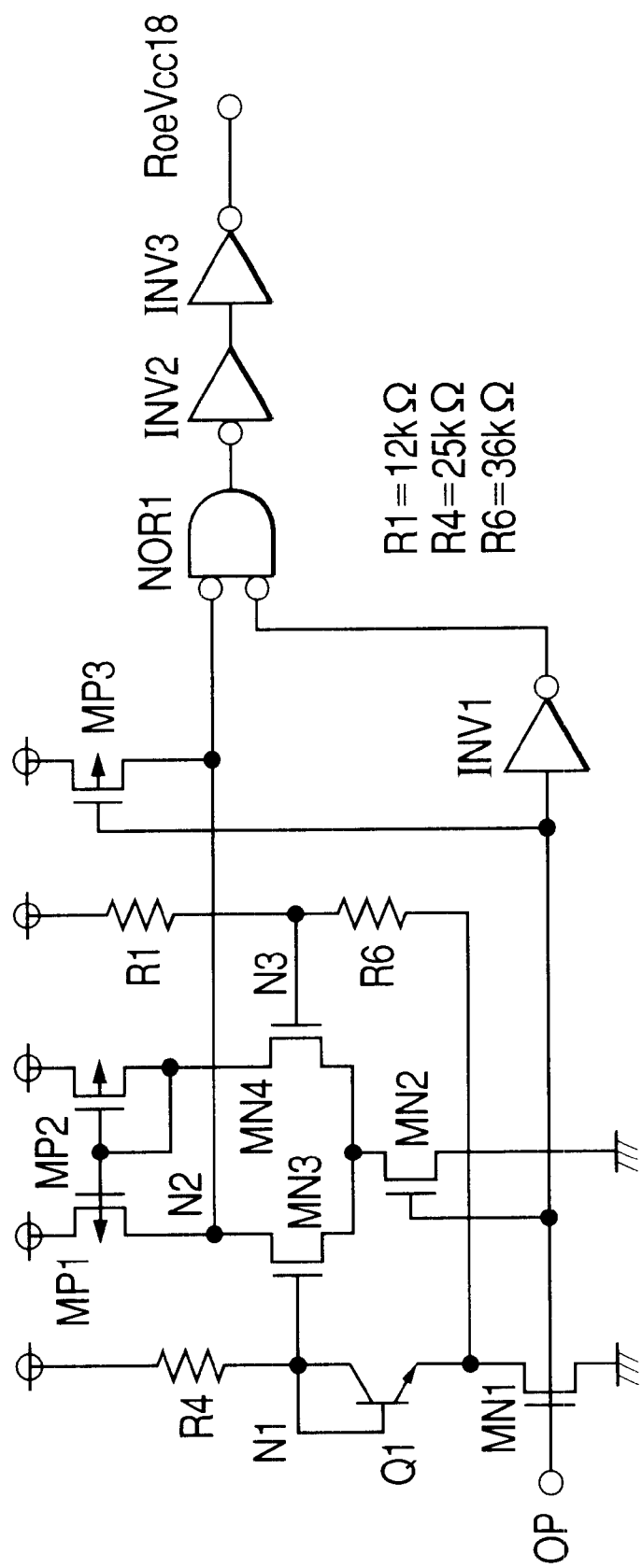
FIG. 17 is a schematic circuit diagram of an embodiment of the low-voltage detection circuit shown in FIG. 11.

FIG. 17 shows an embodiment of the low-voltage detection circuit shown in FIG. 11. This circuit is for Vcc of 1.8 V. A high-level input activation signal OP causes an n-channel MOSFET MN1 to become conductive, and a resulting current flowing through a resistor R4 and bipolar transistor Q1 produces a base-emitter voltage VBE (about 0.7 V) of Q1 on the node N1. The MOSFET MN1 has an on-state resistance that is negligibly small relative to R4.

With the voltage on the node N1 being used as reference voltage, the following differential amplifier amplifies a divided power voltage on the node N3 of resistors R1 and R2, thereby detecting the fall of power voltage. Specifically, when the node N1 voltage is lower than the node N3 voltage, a larger proportion of the current produced by a MOSFET MN2 flows through a MOSFET MN3 relative to another MOSFET MN4 of the differential amplifier, and the differential output current produces a high-level output signal on the node N2. When the node N3 voltage becomes lower than the node N1 voltage, the current of MN3 becomes larger than the current of MN4, resulting in a low-level output signal produced on the node N2. This operation presents the characteristics of low-voltage detection circuit shown in FIG. 12B.

Figure 18:
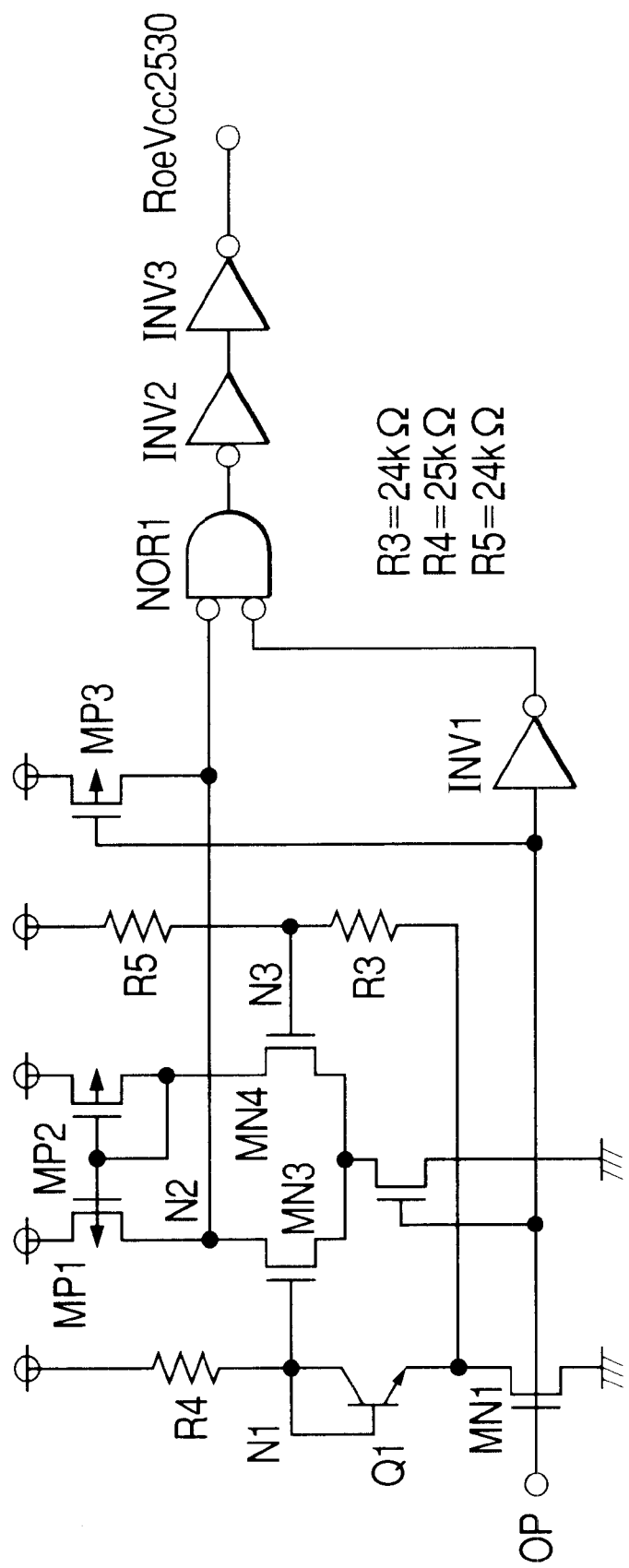
FIG. 18 is a schematic circuit diagram of another embodiment of the low-voltage detection circuit shown in FIG. 11.

FIG. 18 shows an embodiment of the other low-voltage detection circuit shown in FIG. 11. This circuit is for Vcc of 2.5 V and 3.0 V. The circuit arrangement is substantially the same as the preceding one shown in FIG. 17, with a difference being the resistance values of R5 and R3 to have the voltage division ratio for Vcc of 2.5 V and 3.0 V. The circuit of FIG. 17 has R1 and R6 of 12 KΩ and 36 KΩ to have a resistance ratio of 1:3, whereas the circuit of FIG. 18 has R5 and R3 of same 24 KΩ to have a resistance ratio of 1:1.

Figure 19:
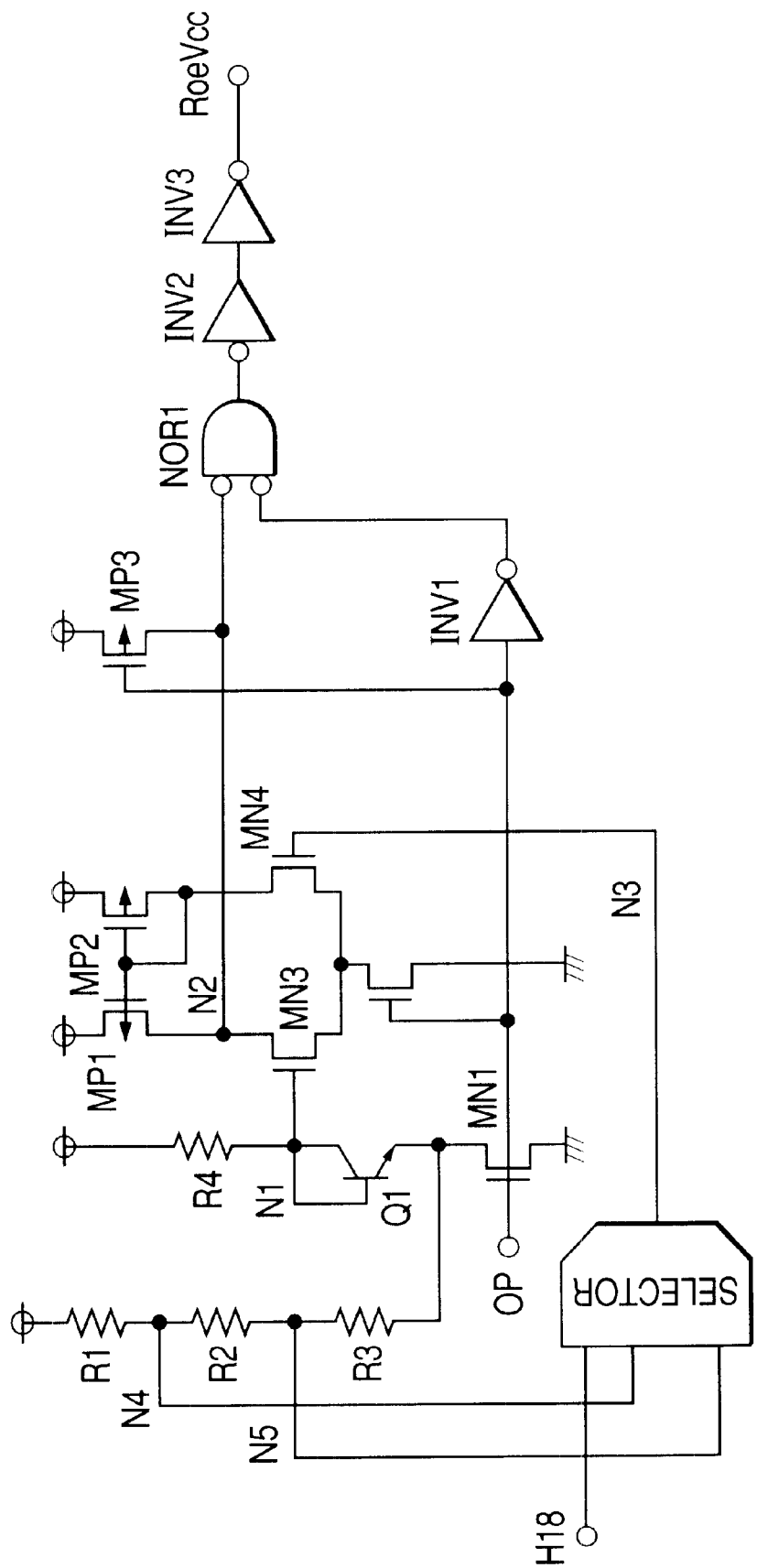
FIG. 19 is a schematic circuit diagram of another embodiment of the low-voltage detection circuit shown in FIG. 11.

FIG. 19 shows another embodiment of the low-voltage detection circuit shown in FIG. 11. This circuit is intended to function by being switched for both Vcc of 1.8 V and Vcc of 2.5 V and 3.0 V. The reference voltage produced by the bipolar transistor Q1 is used commonly, and the taps of a power voltage dividing circuit are selected for Vcc of 1.8 V and Vcc of 2.5 V and 3.0 V by a selector which is controlled by the voltage type switch signal H18. The voltage dividing circuit produces a divided power voltage on the node N4 for Vcc of 1.8 V and another divided power voltage on the node N5 for Vcc of 2.5 V and 3.0 V. The resistors R1, R2 and R3 have a resistance ratio of 1:1:2 to achieve the foregoing individual resistance ratios of 1:3 and 1:1. This embodiment of a shared low-voltage detection circuit reduces the circuit scale and reduces the power consumption.

Figure 20:
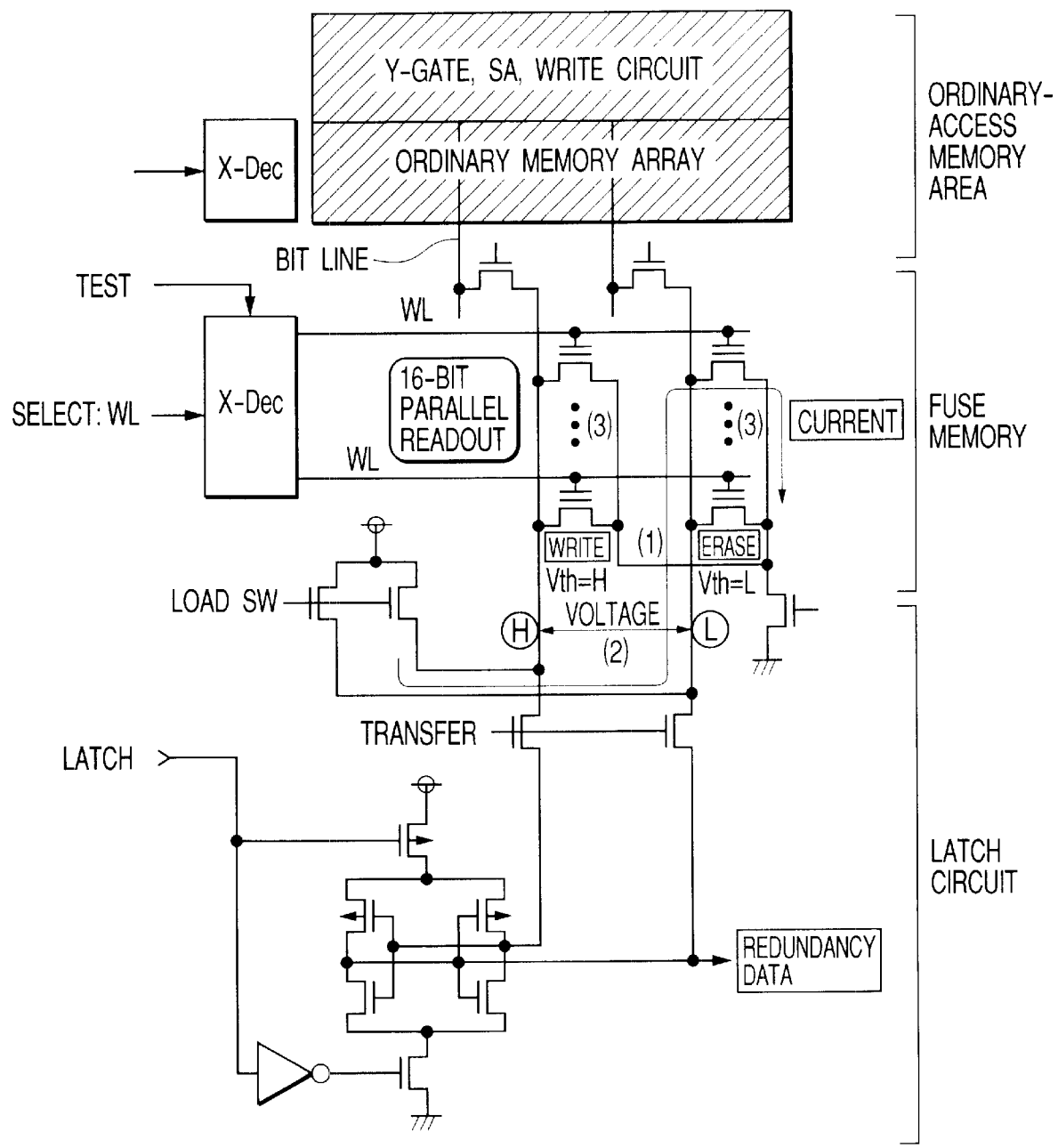
FIG. 20 is a schematic circuit diagram of an embodiment of the flash fuse circuit shown in FIG. 1.

FIG. 20 shows an embodiment of the flash fuse circuit shown in FIG. 1. This flash fuse circuit is the one described in detail in Japanese Patent Unexamined Publication No.2000-34245 of the same applicant of the present invention. In case the redundancy data and voltage type switching signal are memorized in nonvolatile memory cells, their functions are lost if these memory cells become defective.

The flash fuse circuit of this embodiment uses two sets of 16 memory cells (32 memory cells) to memorize a data bit. Specifically, complementary data bits are stored in two sets of memory cells and read out with a differential amplifier. Even in the presence of a defective memory cell among 16 memory cells, a total memory current of 16 memory cells in parallel connection, which undergoes differential evaluation, represents correctly a data bit to be written or read out.

Figure 21:
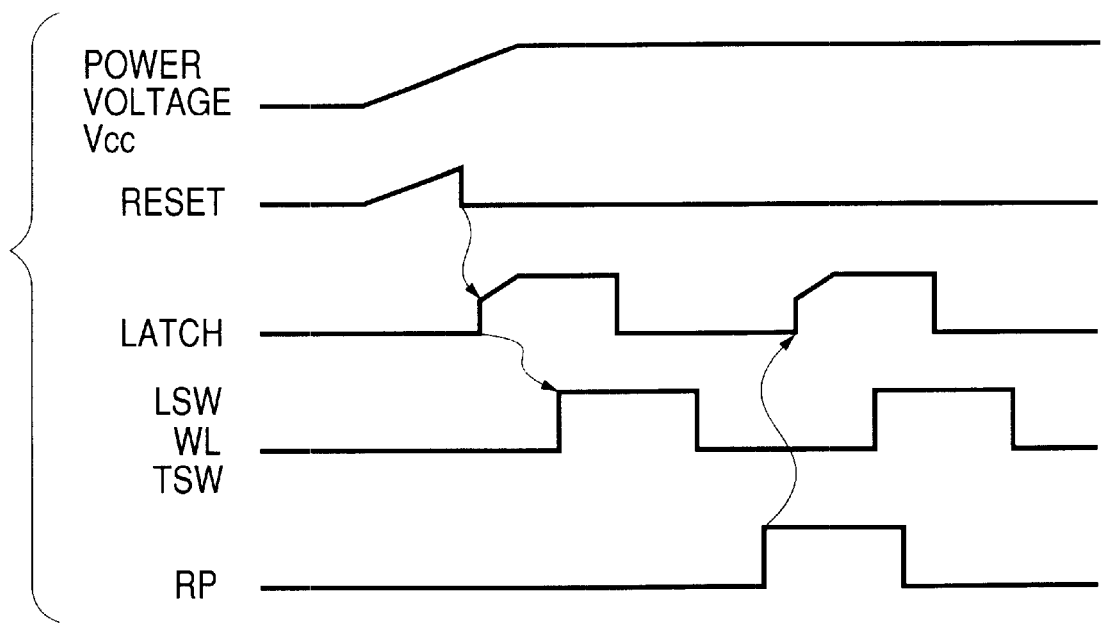
FIG. 21 is a waveform diagram used to explain the operation of the flash fuse circuit shown in FIG. 20.

FIG. 21 explains by waveform diagram the operation of the flash fuse circuit shown in FIG. 20. The circuit receives the power-on reset signal RESET to produce a latch enable signal LATCH, load switch signal LSW, word line signal WL and transfer switch signal TSW, and reads out and latches flash fuse data (redundancy data, voltage trimming data, etc.) The flash fuse data is also used for the voltage type switching signal. The circuit also operates in response to the external reset signal RP, in addition to the above-mentioned power-on event, to produce the latch enable signal LATCH for data readout.

The flash fuse data needs to be loaded into the readout latch at the time of power-on, and the type of 1.8 V or the type of 2.5 V or 3.0 V is selected by the voltage type switch signal H18 which is determined solely by the bonding pad BOP. By the read operation of the flash fuse circuit, the fuse signal shown in FIG. 2 and FIG. 3 is produced to release the signal H25 or H30 depending on its level when the signal H18 is low.

Figure 22:
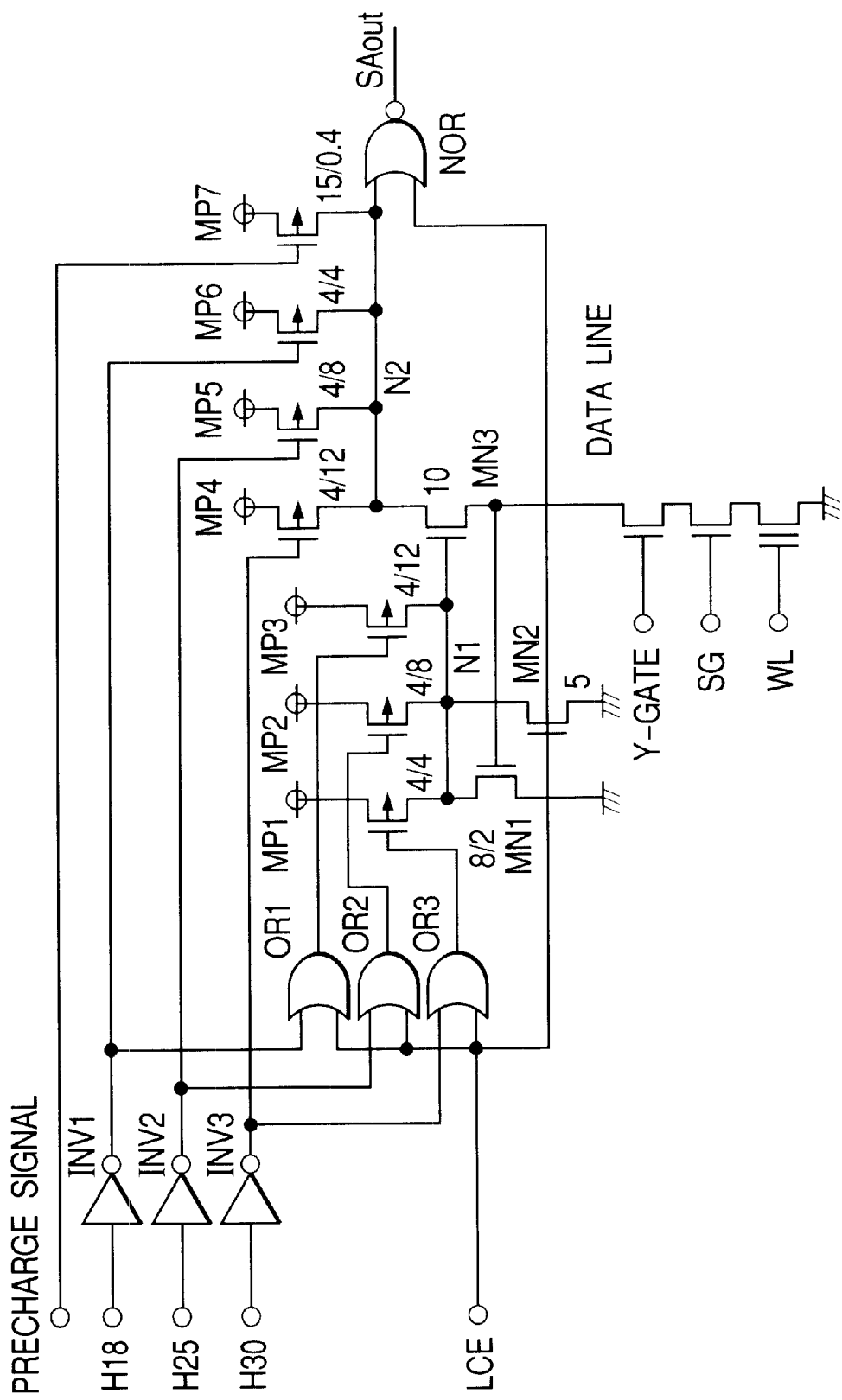
FIG. 22 is a schematic circuit diagram of an embodiment of the sense amplifier shown in FIG. 1.

FIG. 22 shows an embodiment of the sense amplifier shown in FIG. 1. This is a single-ended sense amplifier. A memory cell has its readout current conducted by way of the select gate PG and y-select circuit y-gate to the source of amplifying MOSFET MN3. The MN3 operates for amplification based on its gate-grounded and source-input configuration. N-channel MOSFET MN1 and p-channel MOSFET MP1–MP3 divide the power voltage to feed a bias voltage to the node N1. The MOSFET MN3 responds to the voltage of node N1 to produce a precharge voltage on the data line Data. The precharge voltage is fed back to the gate of MOSFET MN1 so that the voltage is virtually constant.

A memory cell is selected, and the memory current flows through the MOSFET MN3. The memory cell on its on state causes the data line voltage to fall, and a resulting larger on-state resistance of MOSFET MN1 raises the node N1 voltage thereby to limit the fall of data line voltage. The memory cell on its off state tends to raise the data line voltage, but a resulting smaller on-state resistance of MOSFET MN1 limits the rise of node N1 voltage. It is intended to speed up the readout operation by reducing the voltage swing of data line when on-state memory cells and off-state memory cells are read out successively in response to the switching of word lines.

The amplifying MOSFET MN3 has its drain connected with load MOSFETs MN4–MN7, and the memory current flowing through the MN3–MN7 is converted into a voltage signal on the node N2. The voltage signal is assessed with reference to the logic threshold voltage of NOR gate NOR, and a high-level or low-level sense output SAout is produce.

This sense amplifier has a different node N1 voltage and gain of amplifying MOSFET MN3 and load MOSFET depending on the power voltage. On this account, it is designed such that among the MOSFETs MP1, MP2 and MP3, which determine the node N1 voltage in correspondence to power voltages Vcc of 1.8 V, 2.5 V and 3.0 V, is selected in correspondence to the voltage type switch signals H18, H25 and H30, and also among the load MOSFETs MP4, MP5 and MP6 is selected in correspondence to the signals H30, H25 and H18, so that a current-converted voltage signal corresponding to the presence or absence of the memory current is produced on the node N2. Namely, the MOSFETs MP1, MP2 and MP3 undergo the switching so that the precharge voltage on the data line Data is constant irrespective of the power voltage, and also the load MOSFETs MP4, MP5 and MP6 undergo the switching to achieve a constant amplifier gain to match with the power voltage.

Signal LCE is the sense amplifier activation signal, and its high level turns off the MOSFETs MP1, MP2 and MP3 and turns on the MOSFET MN2, thereby turning off the amplifying MOSFET MN3. Consequently, the sense amplifier has its d.c. current paths cut off to reduce the power consumption.

Figure 23:
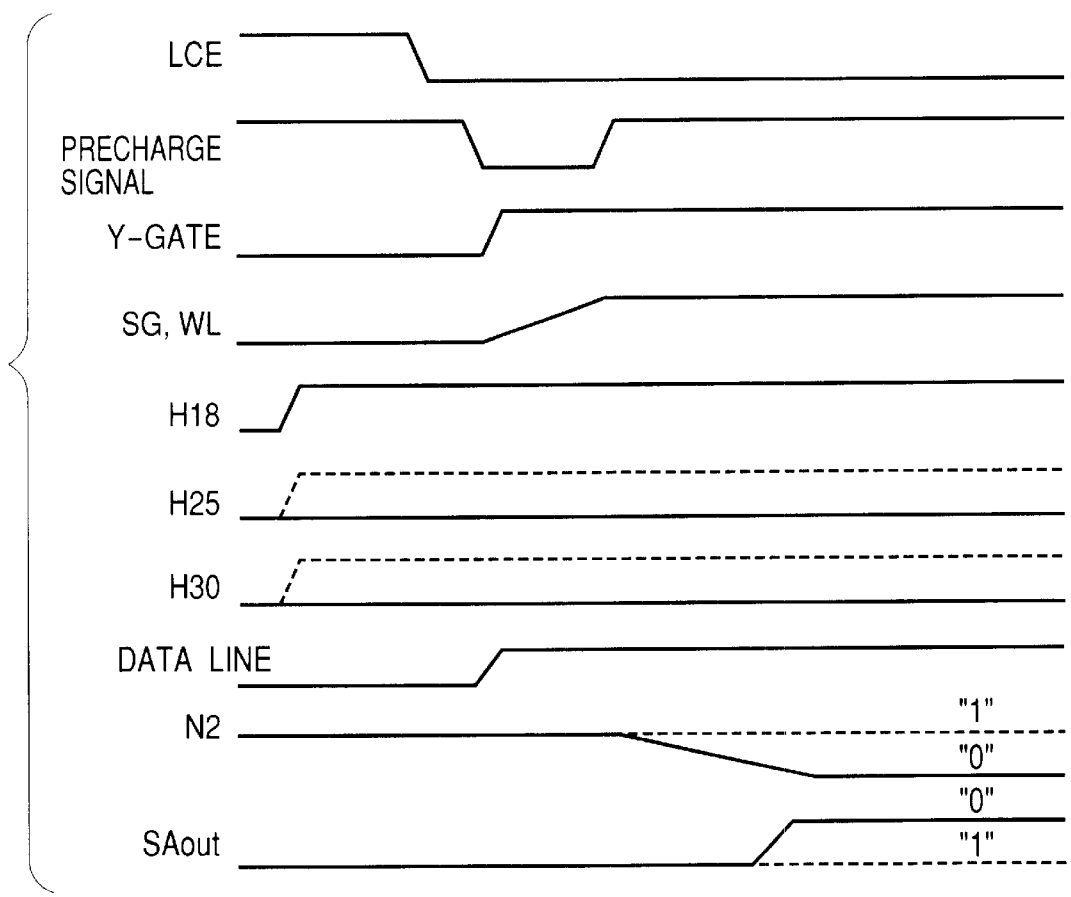
FIG. 23 is a waveform diagram used to explain the operation of the sense amplifier shown in FIG. 22.

FIG. 23 explains by waveform diagram the operation of the sense amplifier shown in FIG. 22. The sense amplifier is put into operation by a low-level activation signal LCE. The precharge signal is turned low, and precharging of node N2 terminates. The y-gate signal is turned high and the select gate PG and word line WL signals are turned to the high level for selection. The high-level y-gate signal precharges the data line to the high level. In response to the selection of the select gate PG and word line WL signals, the presence of memory current causes the node N2 to have low level as shown by the solid line, or the absence of memory current causes the node N2 to stay at high level as shown by the dashed line. The voltage of the node N2 is assessed with reference to the logic threshold voltage of NOR gate NOR, and a high-level or low-level read-out signal SAout is produced.

Figure 24:
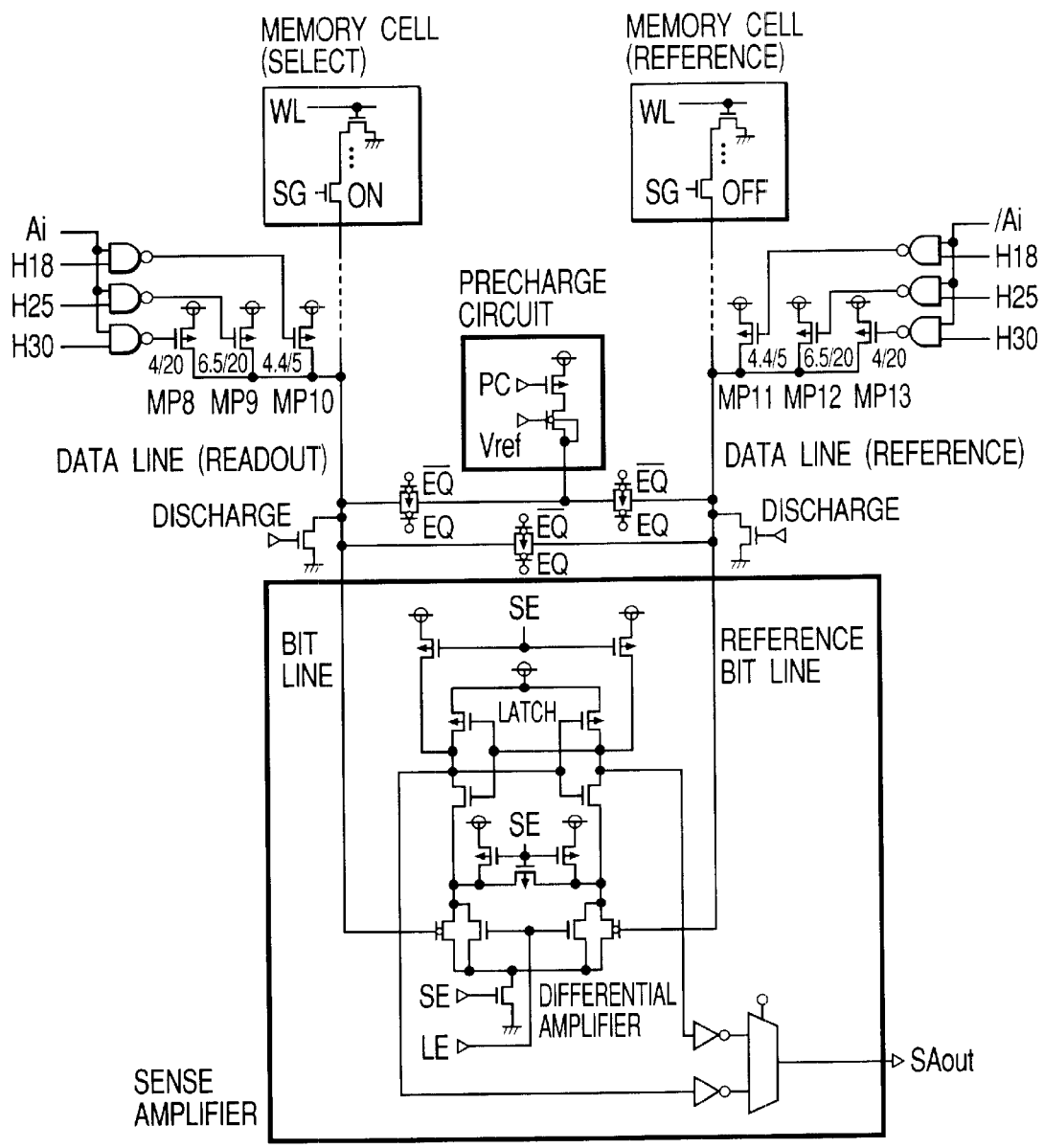
FIG. 24 is a schematic circuit diagram of another embodiment of the sense amplifier shown in FIG. 1.

FIG. 24 shows another embodiment of the sense amplifier shown in FIG. 1. This is a differential amplifier. The sense amplifier is located between two memory mats, and it reads out a memory cell of one memory mat by using the data line precharge voltage of another memory mat as reference voltage. The precharge circuit controls the precharging of data lines Data (readout and reference) with a constant voltage Vref which virtually does not have the dependency on the power voltage and temperature, eliminating the need of control of the precharge circuit by the voltage type switch signals.

Specifically, in reading out the left-hand data line Data on the drawing, a load MOSFET which produces a memory current is selected among MP8, MP9 and MP10. The right-hand data line Data is used for reference, and associated load MOSFETs MP11, MP12 and MP13 are kept cut off by the address signal /Ai. These load MOSFETs MP11, MP12 and MP13 operate when the right-hand data line Data is read out.

Figure 25:
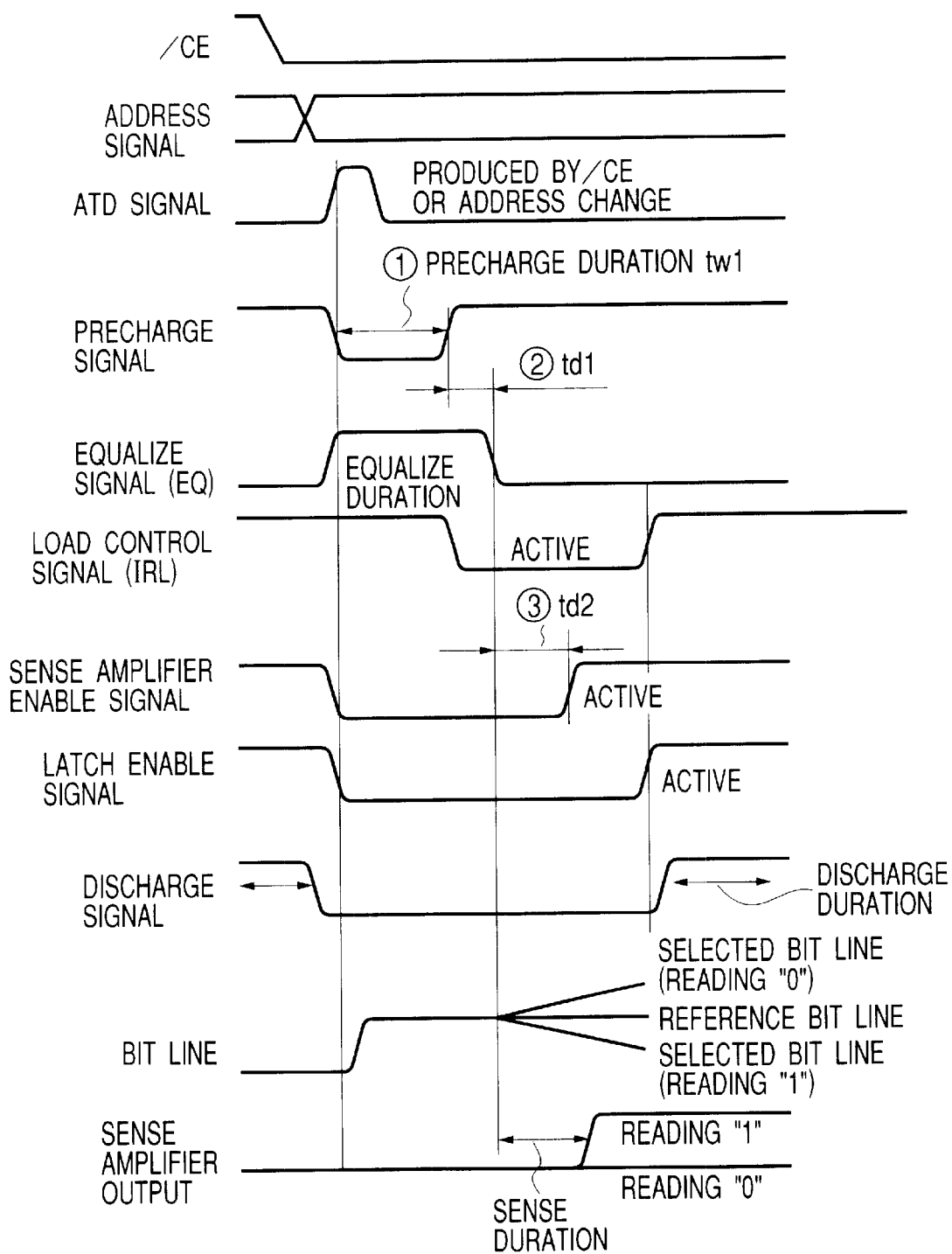
FIG. 25 is a waveform diagram used to explain the operation of the sense amplifier shown in FIG. 24.

FIG. 25 explains by waveform diagram the operation of the sense amplifier shown in FIG. 24. Memory access is initiated by a low-level chip select signal /CE. An address signal is entered, and an address transition detect signal ATD is produced. Alternatively, the signal ATD may be produced in response to the fall of the signal /CE. The signal ATD causes the precharge signal PC and equalize signal EQ to become low for a certain duration. The precharge circuit releases the precharge voltage during the low-level period of the precharge signal PC, and the precharge voltage is placed on the bit lines (readout and reference) during the high-level period of the equalize signal EQ (or low-level period of /EQ).

The signal ATD turns the sense amp enable signal SE, latch enable signal LE, and discharge signal to the inactive level. On completion of precharge operation, the load control circuit is deactivated. After the equalize signal EQ is turned to the low level, the reference bit line retains the precharge voltage, whereas the readout bit line has its parasitic capacitance charged or discharged by a differential current between the current from the load MOSFET and the memory cell current. Specifically, half the current of the on-state memory cell is supplied from the load MOSFET.

If the selected memory cell is in the off state, the bit line is charged to the high level by the current from the load memory cell, or if the selected memory cell is in the on state, the bit line having the precharge voltage is discharged by the current which is twice the current from the load MOSFET. The transition of bit line voltage corresponding to the memory cell on/off state is sensed based on the precharge voltage of the reference bit line. Namely, the differential amplifier MOSFET amplifies the voltage difference between the bit lines in response to a high-level sense amplifier enable signal, the latch circuit latches the amplified signal in response to a high-level latch enable signal. The latch circuit turns the discharge signal to the high level through the output circuit, causing the bit lines to be discharged to the low level preparatory to the next operation cycle.

Figure 26:
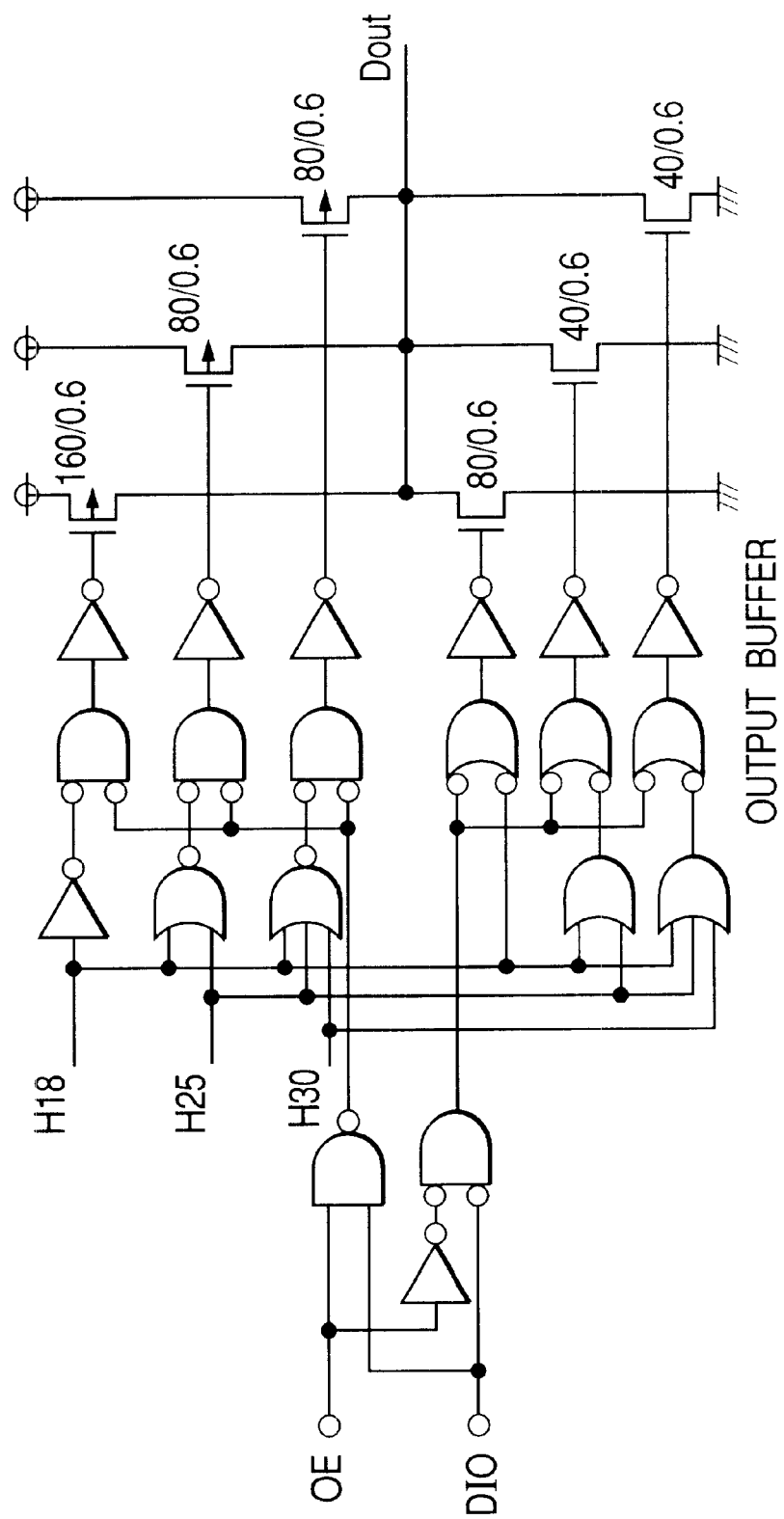
FIG. 26 is a schematic circuit diagram of an embodiment of the output buffer shown in FIG. 1.

FIG. 26 shows an embodiment of the output buffer shown in FIG. 1. The output buffer circuit tends to have a larger drive power of MOSFET at a higher power voltage, and a resulting unnecessarily large load current creates a noise. Therefore, it is necessary to control the drive power depending on the power voltage. This output buffer is designed to turn on output MOSFETs selectively to match with the power voltage in response to the voltage type switch signal H18, H25 or H30.

Specifically, at a power voltage Vcc of 1.8 V, all of three p-channel MOSFETs and three n-channel MOSFETs are turned on to produce the necessary load current. At a power voltage Vcc of 2.5 V, three p-channel MOSFETs and two n-channel MOSFETs are turned on to produce the necessary load current. At a power voltage Vcc of 3.0 V, three p-channel MOSFETs and one n-channel MOSFET are turned on to produce the necessary load current.

Figure 27:
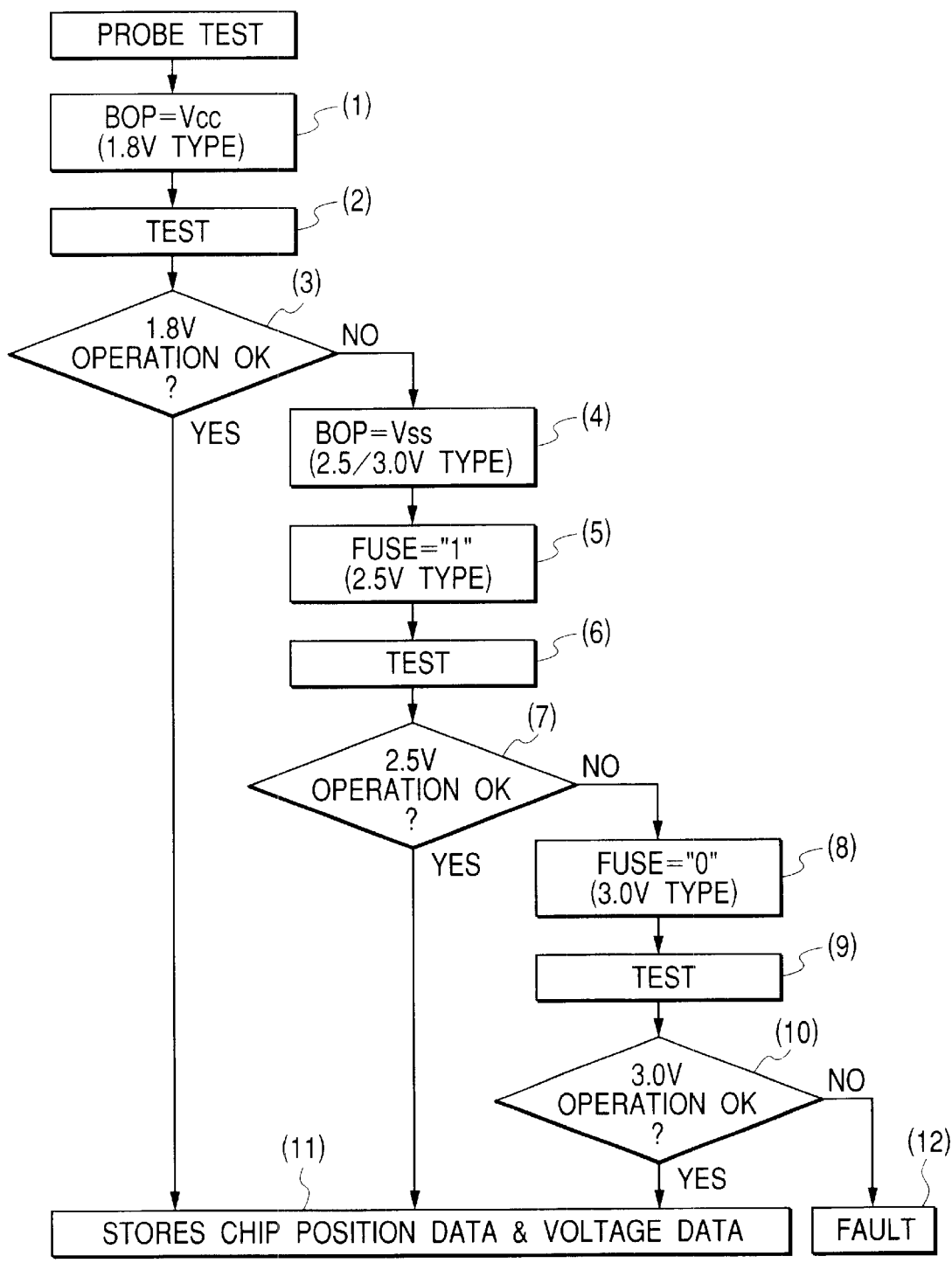
FIG. 27 is a flowchart showing an embodiment of the test process (front-end process) of the semiconductor chip pertinent to the inventive manufacturing method of semiconductor integrated circuit devices.

FIG. 27 shows by flowchart an embodiment of the test process (front-end process) of a semiconductor chip pertinent to the inventive manufacturing method of semiconductor integrated circuit devices. Following the formation of semiconductor chips of the flash memory of the foregoing embodiments on a wafer, a probe test is conducted as follows.

Step (1) makes a voltage setup for a power voltage Vcc of 1.8 V on the bonding pad. Step (2) implements the memory operation test at Vcc of 1.8 V. Step (3) judges the normality of memory operation, and step (11) stores chip position data and voltage data for a good semiconductor chip. Identification of 1.8-V operability may be recorded if the flash fuse can allot another flash fuse. Two flash fuses each made up of 32 memory cells as described above suffice for distinction among 1.8 V, 2.5 V and 3.0 V.

Step (3) makes a voltage setup for Vcc of 2.5/3.0 V on the bonding pad for a chip which has failed at the judgement step (3). Step (5) writes the flash fuse to set up Vcc of 2.5 V. Step (6) implements the memory test at Vcc of 2.5 V. Step (7) judges the normality of memory operation, and step (11) stores chip position data and voltage data for a good semiconductor chip. Identification of 2.5-V operability is recorded when necessary.

Step (8) writes the flash fuse to set up Vcc of 3.0 V for a chip which has failed at the judgement step (7). Step (9) implements the memory operation test at Vcc of 3.0 V. Step (10) judges the normality of memory operation, and step (11) stores chip position data and voltage data for a good semiconductor chip. Identification of 3.0-V operability is recorded when necessary. A chip which has failed the judgement step (10) is determined to be defective.

When the wafer is cut into chips, the chip position data and voltage data collected at step (11) are used for the classification of performance of the chips. In case voltage data is not stored in the flash fuse, chips are marked or collected by being classified.

According to this test process, semiconductor chips which have proved to be operative at 1.8 V are recognized to be operative also at 2.5 V and 3.0 V, instead of undergoing the operation tests of 2.5 V and 3.0 V. Similarly, semiconductor chips which have proved to be operative at 2.5 V are recognized to be operative also at 3.0 V, instead of undergoing the operation test of 3.0 V. For semiconductor chips which are proved to be operative at the worst power condition of 1.8 V, the possibility of failing the 2.5 V or 3.0 V test is conceived to be very small. Skipping the operation test at the relaxed voltage conditions thereby to reduce the testing time contributes to the reduction of overall manufacturing cost.

A semiconductor integrated circuit device formed of MOSFETs, which is designed to operate at such a low voltage as 1.8 V, can be assumed to operate normally at higher voltages of 2.5 V and 3.0 V. It signifies that a circuit device which has failed the 1.8-V operation test can possibly be operative at a higher power voltage. By utilizing this property of semiconductor integrated circuit device formed of MOSFETs in conducting the operation test, it is possible to raise the yield of products.

In case semiconductor chips designed to be operative at various power voltages are merely set up to operate at a certain voltage based on the bonding option or the like, the chips are merely verified for the quality by the test at the designated power voltage and do not contribute to the improvement of the yield of products. Whereas, designing semiconductor chips to be operative at various power voltages and implementing the voltage test which is accompanied by the performance classification of chips as mentioned above, it is possible to raise the yield of products as the whole.

Figure 28:
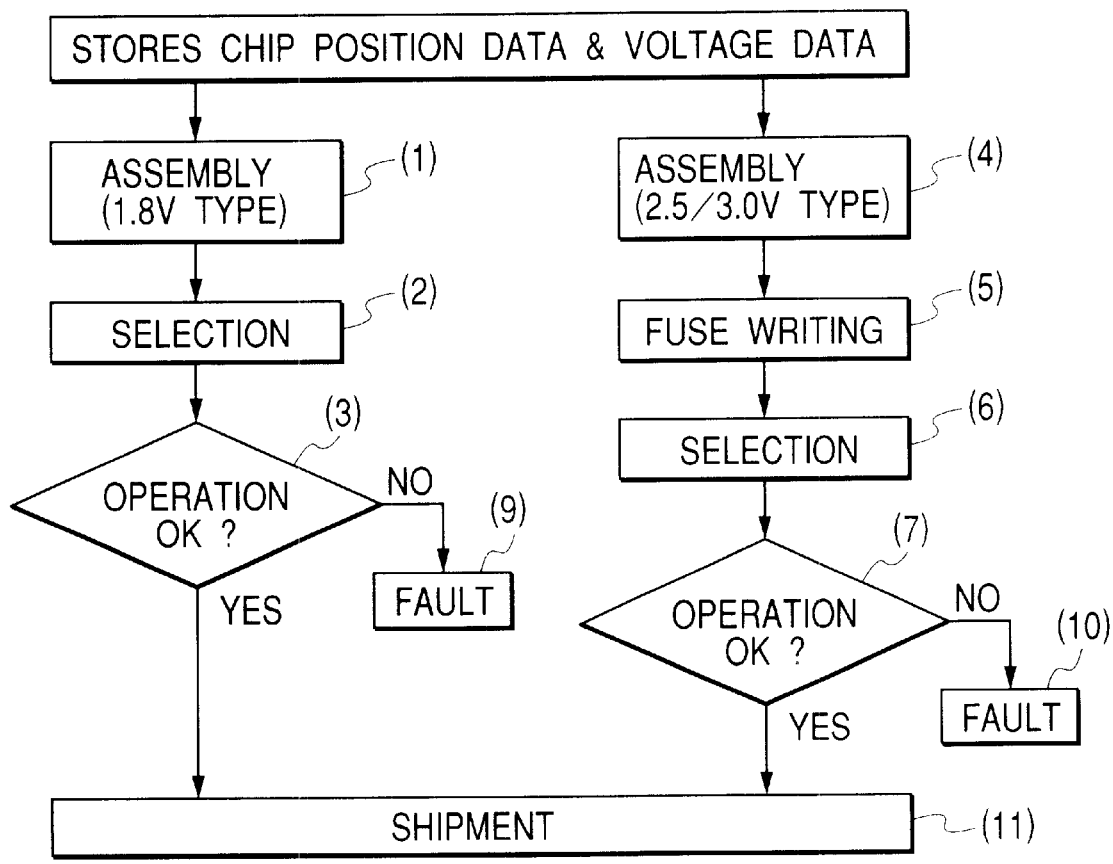
FIG. 28 is a flowchart showing an embodiment of the assembling process (back-end process) pertinent to the inventive manufacturing method of semiconductor integrated circuit devices.

FIG. 28 shows by flowchart an embodiment of the assembly process (back-end process) of semiconductor chips pertinent to the inventive manufacturing method of semiconductor integrated circuit devices. Step (1) uses the chip position data and voltage data obtained in the front-end process to implement the assembly process inclusive of bonding and sealing for a semiconductor chip which has been proved to be operative at 1.8 V. Step (2) implements with the testing equipment including FIC handlers the selection test for an assembled semiconductor integrated circuit device. Step (3) separates a faulty devices to be rejected in step (9) and passes a good device to step (11) for shipment.

Step (4) assembles a circuit device of 2.5 V type from a chip which has been proved to be operative at 2.5 V and also from one which has been proved to be operative at 1.8 V. The step (4) also assembles a circuit device of 3.0 V type from a chip which has been proved to be operative at 3.0 V and also from one which has been proved to be operative at 1.8 V or 2.5 V. Namely, a chip is set up to be 2.5/3.0 V type by bonding, and the subsequent step (5) writes the flash fuse to set up the device to be of 2.5 V type or 3.0 V type. Step (6) implements with the testing equipment including FIC handlers the selection test for an assembled semiconductor integrated circuit device. Step (7) separates a faulty device to be rejected in step (10) and passes a good device to step (11) for shipment.

Namely, the probe test shown in FIG. 27 classifies semiconductor chips into 1.8-V operation type, 2.5-V operation type and 3.0-V operation type. The chips of 1.8-V operation type and 2.5-V operation type are set up by bonding to be 2.5/3.0 V type. Depending on the market situation, these devices have their flash fuses written to be 2.5 V type or 3.0 V type, and are shipped. In consequence, it becomes possible to meet smoothly the varying demand of 2.5 V devices and 3.0 V devices. The 3.0 V devices is useful in the 3.0 V environment obviously.

Figure 29:
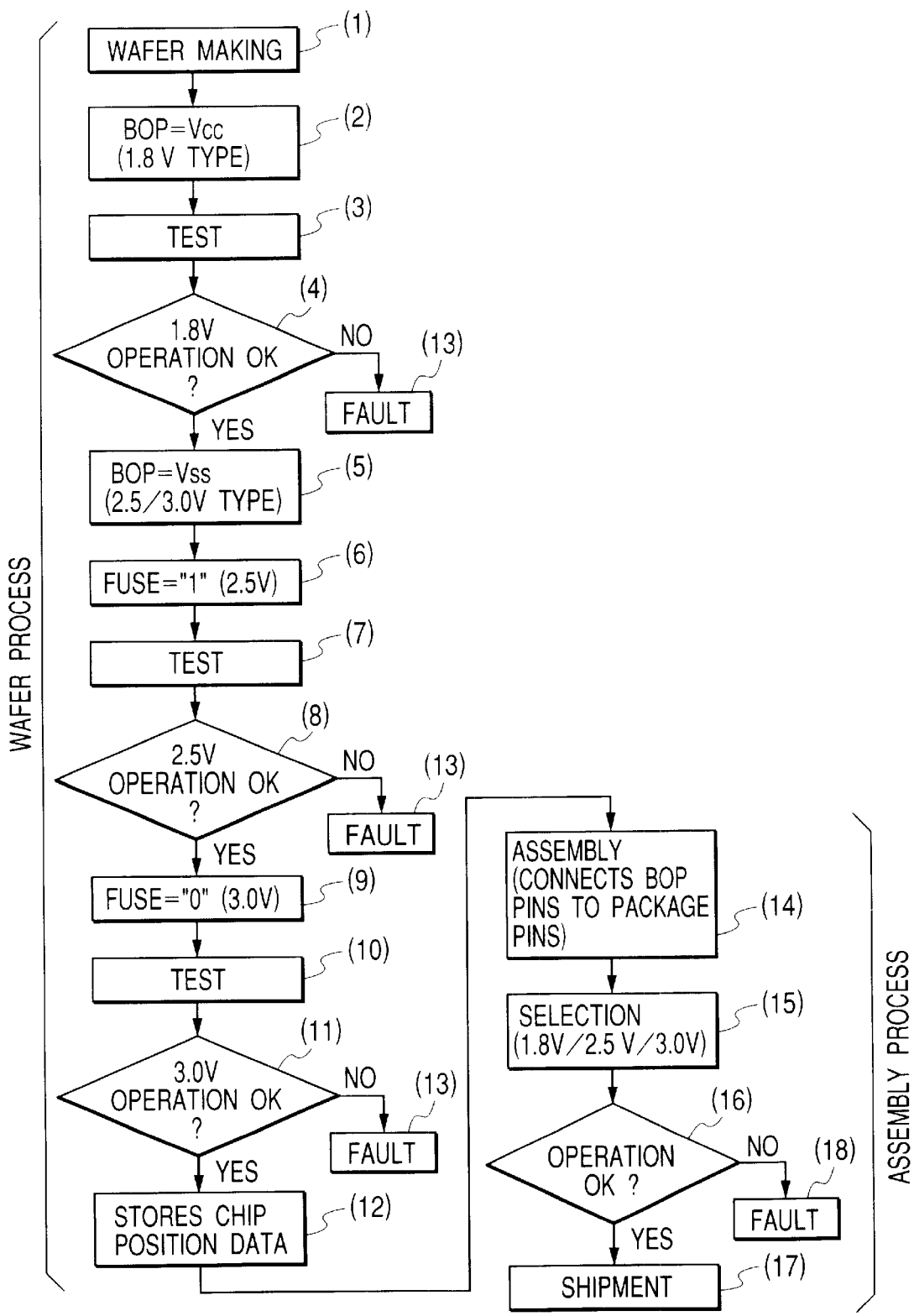
FIG. 29 is a flowchart showing another embodiment of the wafer process and assembly process pertinent to the inventive manufacturing method of semiconductor integrated circuit devices.

FIG. 29 shows by flowchart another embodiment of the wafer process and assembly process pertinent to the inventive manufacturing method of semiconductor integrated circuit devices. Following the formation of semiconductor chips of the flash memory of the foregoing embodiments on a wafer in step (1), a probe test is conducted as follow.

Step (2) makes a voltage setup for a power voltage Vcc of 1.8 V on the bonding pad. Step (3) implements the memory operation test at Vcc of 1.8 V. Step (4) judges the normality of memory operation.

Step (5) makes a voltage setup for Vcc of 2.5/3.0 V on the bonding pad for a chip which has been proved to be good. Step (6) writes the flash fuse to set up Vcc of 2.5 V. Step (7) implements the memory operation test at Vcc of 2.5 V. Step (8) judges the normality of memory operation.

Step (9) writes the flash fuse to set up Vcc of 3.0 V for a chip which has been proved to be good. Step (10) implements the memory operation test at Vcc of 3.0 V. Step (11) judges the normality of memory operation, and step (12) stores chip position data and voltage data of a chip which has been proved to be good. As a result of these processes, a memory chip which has been proved to be operative at all three kinds of power voltage is selected.

For the enhancement of the yield of products, chips which have failed the operation test of step (4) and chips which have failed the operation test of step (8) are subjected to the setting of a higher voltage, operation test and selection, although these processes are not shows in the figure, in the same manner as explained on the flowchart of FIG. 27, and the chip position data and voltage data are stored.

A chip which has passed the above-mentioned operation tests of all power voltages undergoes the assembly process as follows. Step (14) connects the bonding pad BOP to the external terminal, instead of applying a fixed voltage. Step (15) writes the flash fuse to set up voltages of 1.8 V, 2.5 V and 3.0 V and supplies the voltages to the external terminal sequentially. Step (16) implements the operation tests at these voltages, and passes a good device which has been proved to be operative for shipment. Circuit devices which are operative at all of three kinds of power voltage can be used by being set to any of the three power voltages by the user.

The above-mentioned probe test selects good chips which are operative at all ranks of 1.8 V, 2.5 V and 3.0 V. The assembly process implements the voltage-based selection by connecting the bonding option pad to unused pins of package. The manner of flash fuse writing is notified to users, who then can switch the operating voltage among 1.8 V, 2.5 V and 3.0 V.

Among the circuit devices which have failed in the selection of step (16), those which are operative at 2.5 V or 3.0 V may be shipped with a specification note indicative of the restriction to the BOP terminal voltage application and flash fuse data of 2.5 V or 3.0 V. Those which are operative only at 3.0 V may be shipped with a specification note indicative of the restriction to the BOP terminal voltage application and flash fuse data of 3.0 V.

Figure 30:
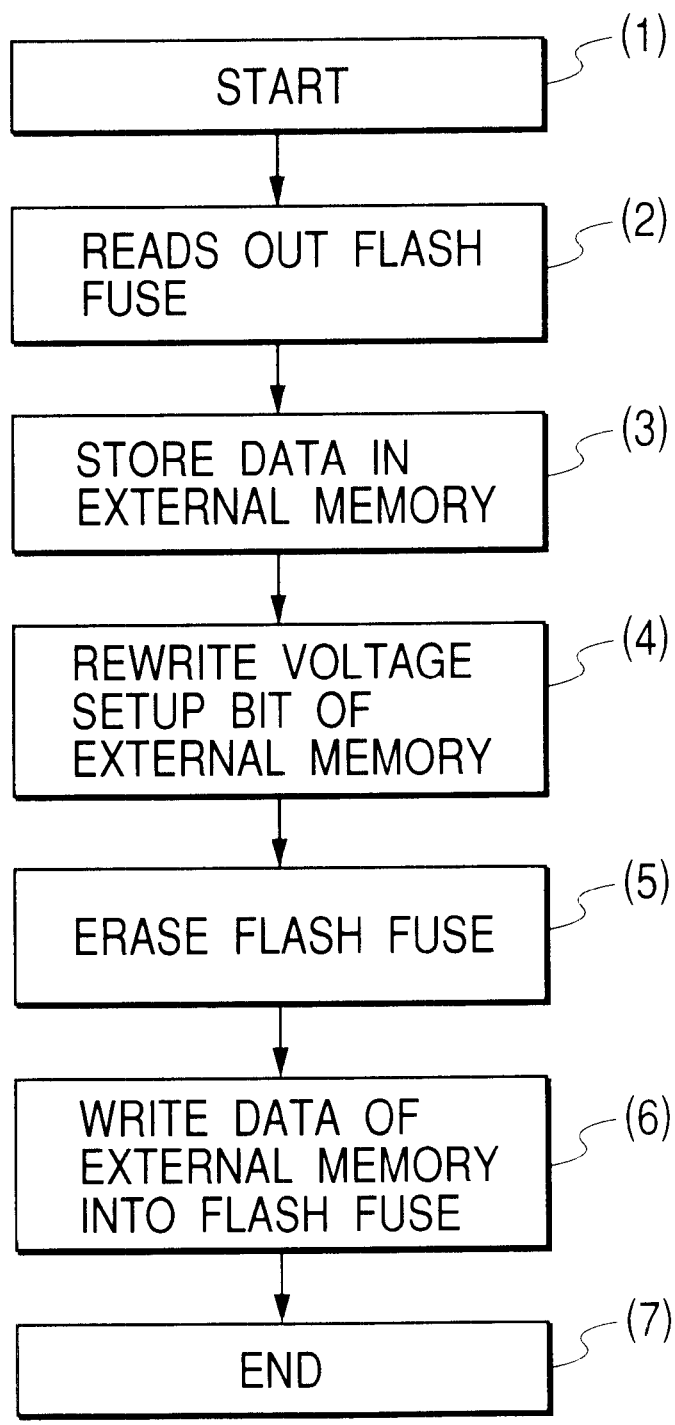
FIG. 30 is a flowchart used to explain an embodiment of the rewrite operation of the flash fuse used by the present invention.

FIG. 30 shows by flowchart an embodiment of the flash fuse rewrite operation based on this invention. The flash fuse is inherently intended for storing trimming data and redundancy data, and therefore these data must not be destroyed in writing or rewriting the voltage type setup data and test result data.

Step (1) connects a flash memory to a flash memory writer. Step (2) reads out data from the flash fuse, and step (3) stores the data in an external memory. Step (4) rewrites the voltage type setup bit out of the data stored in the external memory. The test result data is written to the relevant bits of data. Step (5) erases the entire flash fuse, and step (6) writes the contents of the external memory into the flash fuse. Consequently, only the voltage type setup bit (and test result data bits) is revised.

Figure 31:
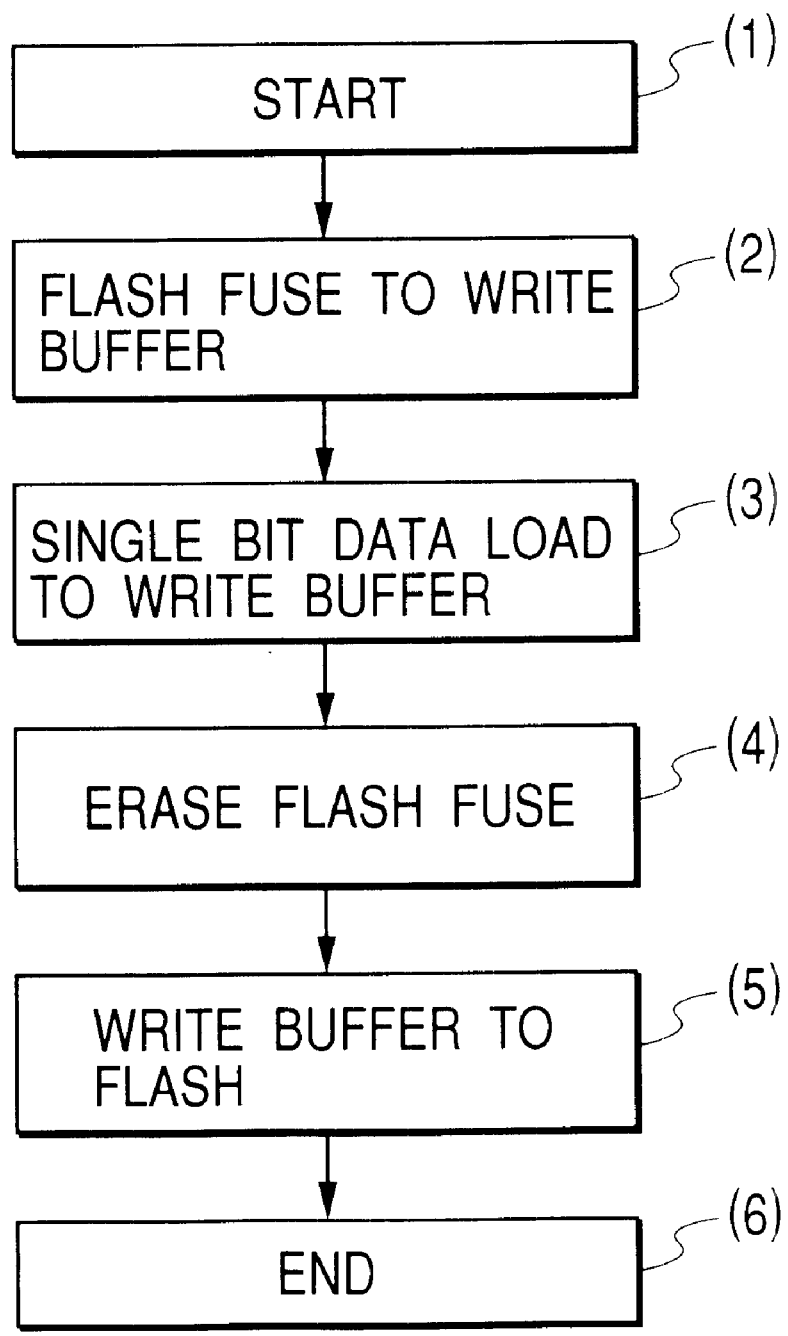
FIG. 31 is a flowchart used to explain another embodiment of the rewrite operation of the flash fuse used by the present invention.

FIG. 31 shows by flowchart another embodiment of the flash fuse rewrite operation based on this invention. The flash fuse is rewritten by use of the write buffer included in the flash memory, instead of using an external memory.

The IC tester starts the flash fuse rewrite operation at step (1). Step (2) reads data out of the flash fuse into the write buffer. Step (3) rewrites only the voltage type setup bit in the write buffer. Step (4) erases the entire flash fuse, and step (5) writes the contents of the write buffer into the flash fuse. Consequently, voltage type setup data in the flash fuse can be revised without using an external memory.

Figure 32A:
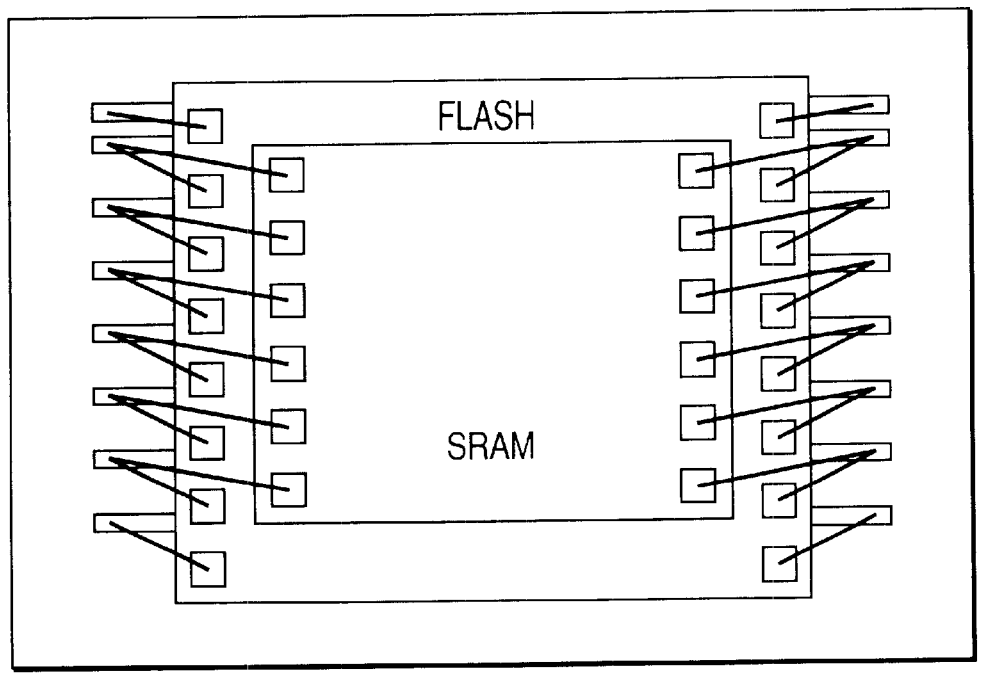
FIGS. 32A and 32B are diagrams showing the package structure for the stacked SCRAM and flash memory based on the present invention.
Figure 32B:
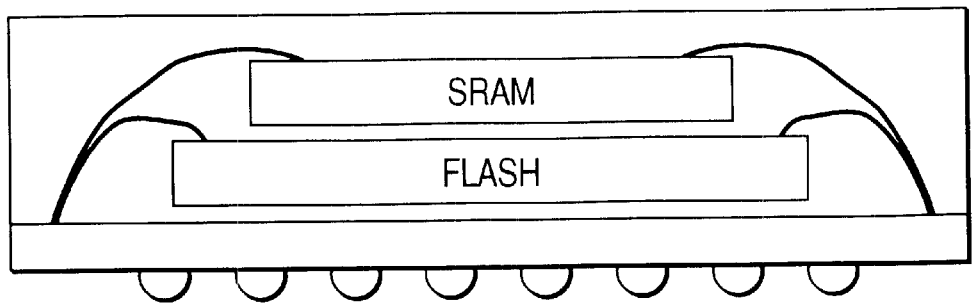

FIGS. 32A and 32B show a plan view and the cross section of the package structure of the stacked SRAM and flash memory based on this invention. It is possible also for a semiconductor integrated circuit device of this stacked structure to select the operating voltage of the flash memory in accordance with the power voltage of the SRAM, expanding the selection range of SCRAM which is stacked on the flash memory. Semiconductor chips which are operative at all power voltages can have their flash memory operating voltage set up in accordance with the power voltage of SCRAM, and these chips can be treated much easily in the assembly process due to the absence of condition of combination.

Remaining semiconductor chips which are operative only at 2.5 V or 3.0 V can be combined with other semiconductor chips of such as SRAM or CPU by reading out their test result data recorded in the flash fuse. Instead of assembling multiple semiconductor chips based on stacking to complete a semiconductor integrated circuit device, these chips may be arranged on a plane.

As described above, the present invention accomplishes the multi-voltage operation within a single semiconductor chip. The voltage type switch signal is produced within the chip based on the combination of a bonding pad and flash fuse, thereby switching the voltage-dependent circuit parameter or circuit itself so that the circuit operates stably. For coping with different power voltages of semiconductor integrated circuit devices such as flash memories depending on individual application systems, the inventive semiconductor integrated circuit device is capable of altering the power voltage setup based on the bonding pad and flash fuse within the chip during the back-end process, whereby it is possible to respond smoothly to varying demands in regard to the power voltage.

The inventive semiconductor chip arranged as described above can be value-added over conventional semiconductor chips. Specifically, chips that cannot operate at a lower power voltage are made useful with the operational condition of a higher power voltage. Chips that can operate at a lower power voltage, and naturally can operate at higher voltages, are categorized to be universal. Consequently, it is possible to determine the voltage type of semiconductor integrated circuit devices at their assembly process to meet the demand of products, enabling the efficient manufacturing of semiconductor integrated circuit devices.

The effectiveness achieved by the foregoing embodiments of this invention is as follows.

(1) The inventive semiconductor chip is arranged to include a common circuit block which is operative at a first voltage and a second voltage that is higher than the first voltage, a first circuit block which is designed to fit the first voltage and operate in unison with the common circuit block, a second circuit block which is designed to fit the second voltage and operate in unison with the common circuit block, and a voltage type setup circuit which activates one of the first and second circuit blocks, with a first identification record indicative of the operability at the first voltage or a second identification record indicative of the operability only at the second voltage being held by the chip, whereby it is possible to raise the production yield of semiconductor chips and make the chips uniquely value-added, thereby enabling the flexible, efficient and demand-responsive manufacturing of semiconductor integrated circuit devices.

(2) In addition to the foregoing, the common circuit block is designed to be operative at a third voltage that is higher than the second voltage, the semiconductor chip further includes a third circuit block which is designed to fit the third voltage and operate in unison with the common circuit block, and the voltage type setup circuit activates one of the first, second and third circuit blocks, with the first and second identification records indicating the operability at the first and second voltages, respectively, and with a third identification record indicative of the operability at the third voltage being added, whereby it is possible to further raise the production yield of semiconductor chips and enable the flexible, efficient and demand-responsive manufacturing of semiconductor integrated circuit devices.

(3) In addition to the foregoing, the first through third identification records are memorized in the electrically writable nonvolatile memory means, whereby it is possible to facilitate the production management of semiconductor chips.

(4) In addition to the foregoing, the first identification record indicates inclusively the operability at the second and third voltages, and the second identification record indicates inclusively the operability at the third voltage, whereby it is possible to be responsive flexibly and efficiently to versatile demands of products.

(5) In addition to the foregoing, the voltage type setup circuit is designed to select one of the first, second and third circuit blocks based on the combination of the bonding pad which is given the ground voltage or power voltage during the bonding process and the electrically writable memory means, whereby it is possible to enhance the degree of integration and make the voltage setup flexible.

(6) The inventive semiconductor integrated circuit device is arranged in a semiconductor chip, which includes a common circuit block which is operative at a first voltage and a second voltage that is higher than the first voltage, a first circuit block which is designed to fit the first voltage and operate in unison with the common circuit block, a second circuit block which is designed to fit the second voltage and operate in unison with the common circuit block, and a voltage type setup circuit which activates one of the first and second circuit blocks, the voltage type setup circuit selecting the first or second circuit block if the chip is operative at the first voltage or selecting the second circuit block if the chip is operative only at the second voltage, whereby it is possible to improve the productivity and yield of semiconductor integrated circuit devices and facilitate the production management.

(7) In addition to the foregoing, the common circuit block is designed to be operative at a third voltage that is higher than the second voltage, the semiconductor chip further includes a third circuit block which is designed to fit the third voltage and operate in unison with the common circuit block, and the voltage type setup circuit activates one of the first, second and third circuit blocks by selecting one of the first, second and third circuit blocks if the chip is operative at the first voltage, selecting the second or third circuit block if the chip is operative only at the second voltage, or selecting the third circuit block if the chip is operative only at the third voltage, whereby it is possible to further improve the productivity and yield of semiconductor integrated circuit devices and facilitate the production management.

(8) In addition to the foregoing, the voltage type setup circuit is designed to select one of the first, second and third circuit blocks based on the combination of the bonding pad which is given the ground voltage or power voltage during the bonding process and the electrically writable memory means, whereby it is possible to enhance the degree of integration and make the voltage setup flexible.

(9) In addition to the foregoing, each of the first through third circuit blocks includes, as circuit blocks of a flash memory, a sense amplifier which reads out stored data of nonvolatile memory cells, a charge pump circuit which produces a voltage for the write and erase operations, an oscillation circuit, a power-on detection circuit, a voltage fall detection circuit, and an output buffer which releases the read-out data, whereby it is possible to improve the productivity and yield of production of flash memories and facilitate the production management.

(10) In addition to the foregoing, the charge pump circuit comprises a multi-stage charge pump circuit which is designed to fit the first voltage, with the number of stages counted from the output stage being switched by the selection signals corresponding to the second and third voltages provided by the voltage type setup circuit, whereby it is possible to reduce the scale of circuit.

(11) In addition to the foregoing, the bonding pad is used to specify the first, second or third voltages and the electrically writable memory means is used to specify the second or third voltage, whereby it is possible to make the voltage setup flexible while stabilizing the operation at power-on.

(12) In addition to the foregoing, the bonding pad is connected to the external terminal so that the voltage type can be set up by the user, whereby it is possible to make semiconductor integrated circuit devices more convenient.

(13) In addition to the foregoing, the first, second and third voltages are 1.8 V, 2.5 V and 3.0 V, respectively, whereby it is possible to make semiconductor integrated circuit devices applicable to various systems formed of CMOS integrated circuits.

(14) The inventive method of manufacturing semiconductor integrated circuit devices includes the steps of forming semiconductor chips on a wafer, each chip including a common circuit block which is operative at a first voltage and a second voltage that is higher than the first voltage, a first circuit block which is designed to fit the first voltage and operate in unison with the common circuit block, a second circuit block which is designed to fit the second voltage and operate in unison with the common circuit block, and a voltage type setup circuit which activates one of the first and second circuit blocks, testing the operability of each chip at the first and second voltages during the probing test process, and setting up the first voltage to the voltage type setup circuit in the assembly process for a chip which is operative at the first voltage or setting up the second voltage to the voltage type setup circuit during the assembly process for a chip which is operative at the first voltage and for a chip which is operative only at the second voltage in accordance with the test result and the demand of products, whereby it is possible to improve the productivity and yield of products and accomplish the rational demand-responsive production management.

(15) In addition to the foregoing, the common circuit block is designed to be operative at a third voltage that is higher than the second voltage, the semiconductor chip further includes a third circuit block which is designed to fit the third voltage and operate in unison with the common circuit block, and the voltage type setup circuit activates one of the first, second and third circuit blocks, and the method further tests the operability at the third voltage during the probing test process, sets up the first voltage to the voltage type setup circuit during the first assembly process for a chip which is proved to be operative at the first voltage, and sets the second voltage to the voltage type setup circuit during the second assembly process for a chip which is proved to be operative at the first or second voltage, and the method further includes a third assembly process including the setup of the third voltage to the voltage type setup circuit for a chip which is proved to be operative at the first or second voltage or only at the third voltage, whereby it is possible to improve further the productivity and yield of products and accomplish the rational demand-responsive production management.

(16) In addition to the foregoing, the method tests the operability at the first, second and third voltages during the probing test process, and determines a semiconductor chip, which has failed the tests at all voltages, to be defective, whereby it is possible to improve the yield of products.

(17) In addition to the foregoing, the method implements the voltage type setup during the first through third assembly processes by applying the ground voltage or power voltage to the voltage setup bonding pad of the bonding process so that the product is finally set up at the time of assembling, whereby it is possible to accomplish the flexible and demand-responsive manufacturing of semiconductor integrated circuit devices.

(18) In addition to the foregoing, the method implements the marking on the package of semiconductor integrated circuit device in correspondence to the set-up voltage type during the first through third assembly processes, whereby it is possible to improve the productivity and yield of products and accomplish the rational demand-responsive manufacturing of semiconductor integrated circuit devices.

Although the present invention has been described in connection with the specific embodiments, the invention is not confined to these embodiments, but various alterations are obviously possible without departing from the essence of the invention. For example, the voltage type may be set up entirely on the bonding pad or by use of other fuse means. Multiple operating voltages are arbitrary besides those voltages mentioned above. In addition to the block erasing nonvolatile memory described in the foregoing embodiments, the present invention is applicable to other memories including electrically erasable MNOS transistor memories, nonvolatile memories erased by the exposure to ultraviolet rays, mask ROMs, static RAMs, and dynamic RAMs. The invention is also applicable to signal processing circuits including microprocessors in addition to these memories.

Among the affairs of the present invention disclosed in this specification, the major effectiveness is briefed as follows.

The inventive semiconductor chip is arranged to include a common circuit block which is operative at a first voltage and a second voltage that is higher than the first voltage, a first circuit block which is designed to fit the first voltage and operate in unison with the common circuit block, a second circuit block which is designed to fit the second voltage and operate in unison with the common circuit block, and a voltage type setup circuit which activates one of the first and second circuit blocks, with a first identification record indicative of the operability at the first voltage or a second identification record indicative of the operability only at the second voltage being held by the chip, whereby it is possible to raise the production yield of semiconductor chips and make the chips uniquely value-added, thereby enabling the flexible, efficient and demand-responsive manufacturing of semiconductor integrated circuit devices.

The inventive semiconductor integrated circuit device is arranged in a semiconductor chip, which includes a common circuit block which is operative at a first voltage and a second voltage that is higher than the first voltage, a first circuit block which is designed to fit the first voltage and operate in unison with the common circuit block, a second circuit block which is designed to fit the second voltage and operate in unison with the common circuit block, and a voltage type setup circuit which activates one of the first and second circuit blocks, the voltage type setup circuit selecting one of the first and second circuit block if the chip is operative at the first voltage or selecting the second circuit block if the chip is operative only at the second voltage, whereby it is possible to improve the productivity and yield of semiconductor integrated circuit devices and facilitate the production management.

The inventive method of manufacturing semiconductor integrated circuit devices includes the steps of forming semiconductor chips on a wafer, each chip including a common circuit block which is operative at a first voltage and a second voltage that is higher than the first voltage, a first circuit block which is designed to fit the first voltage and operate in unison with the common circuit block, a second circuit block which is designed to fit the second voltage and operate in unison with the common circuit block, and a voltage type setup circuit which activates one of first and second circuit blocks, testing the operability of each chip at the first and second voltages during the probing test process, setting up the first voltage to the voltage type setup circuit in the assembly process for a chip which is operative at the first voltage, and setting up the second voltage to the voltage type setup circuit during the assembly process for a chip which is operative at the first voltage and for a chip which is operative only at the second voltage in accordance with the test result and the demand of products, whereby it is possible to improve the productivity and yield of products and accomplish the rational demand-responsive production management.

What is claimed is:

1. A semiconductor chip, which is supplied either a first voltage or a second voltage, comprising:

a common circuit black which is operative at said first voltage or said second voltage that is higher than said first voltage;

a first boast circuit which boosts from said first voltage to an operation voltage;

a second boost circuit which boosts from said second voltage to an operation voltage;

a terminal which receives a signal indicating whether said first voltage is supplied or said second voltage is supplied;

a nonvolatile memory array; and a voltage type setup circuit which activates said first boost circuit when said signal is in a first state, or activates said second boost circuit when said signal is in a second state, wherein said nonvolatile memory array is supplied an operation voltage which is boosted by said first boost circuit when said first voltage is supplied or which is boosted by said second boost circuit when said second voltage is supplied, during operation of said nonvolatile memory array.

2. A semiconductor chip according to claim 1, further comprising a plurality of output terminals, wherein each of said output terminals couples to an output buffer, wherein each output buffer is capable of changing driving power of an output signal according to said signal state, making driving power of said output signal increase when said signal is in said first state, or making driving power of said output signal decrease when said signal is in said second state.

3. A semiconductor chip according to claim 2, wherein said semiconductor chip is supplied one of said first voltage, said second voltage and a third voltage that is higher than said first voltage and is lower than said second voltage, wherein said common circuit block is operative at said third voltage, and wherein said nonvolatile memory array stores data which indicate whether said semiconductor chip is capable of operating by said second voltage or is capable of operating by said third voltage, when said signal is in said second state.

4. A semiconductor chip according to claim 3, further comprising a third boost circuit, wherein said voltage type setup circuit activates said third boost circuit when said signal is in said second state and said stored data in said nonvolatile memory array indicates said semiconductor chip is capable of operating by said third voltage.

5. A semiconductor chip according to claim 4, wherein each output buffer is capable of changing driving power of said output signal to an intermediate level between driving power when said signal is in said first state and driving power when said signal is in said second state.

6. A semiconductor integrated circuit device using a semiconductor chip, which is supplied either a first voltage or a second voltage, the chip comprising:

a common circuit block which is operative at said first voltage or said second voltage that is higher than said first voltage;

a first boost circuit which boosts from said first voltage to said second voltage;

a second boost circuit which boosts from said second voltage to an operation voltage;

a terminal which receives a signal indicating whether said first voltage is supplied or said second voltage is supplied;

a nonvolatile memory array; and a voltage type setup circuit which activates said first boost circuit and said second boost circuit when said signal is in a first state, or activates said second boost circuit when said signal is in a second state, wherein said nonvolatile memory array is supplied an operation voltage which is boosted by said first boost circuit and said second boost circuit when said first voltage is supplied or is boosted by said second boost circuit when said second voltage is supplied, during operation of said nonvolatile memory array.

7. A semiconductor integrated circuit device according to claim 6, wherein said second boost circuit boosts from a second voltage boosted by said first boost circuit when said signal is in said first state, or boosts from a second voltage supplied from outside of said semiconductor chip when said signal is in said second state.

8. A semiconductor integrated circuit device according to claim 7, wherein said semiconductor chip further comprises a plurality of output terminals, and wherein each of said output terminals couples to an output buffer, and wherein each output buffer is capable of changing driving power of an output signal according to said signal state, making driving power of said output signal increase when said signal is in said first state, or making driving power of said output signal decrease when said signal is in said second state.

9. A semiconductor integrated circuit device according to claim 8, wherein said semiconductor chip is supplied one of said first voltage, said second voltage, and a third voltage that is higher than said first voltage and is lower than said second voltage, wherein said common circuit block is operative at said third voltage, wherein said nonvolatile memory array stores data which indicate whether said semiconductor chip is capable of operating by said second voltage or is capable of operating by said third voltage, when said signal is in said second state.

10. A semiconductor integrated circuit device according to claim 9, wherein said semiconductor chip further comprises a third boost circuit, and wherein said voltage type setup circuit activates said third boost circuit when said signal is in said second state and said stored data in said nonvolatile memory array indicates said semiconductor chip is capable of operating by said third voltage.

11. A semiconductor integrated circuit device according to claim 10, wherein each output buffer is capable of changing driving power of said output signal to an intermediate level between driving power when said signal is in said first state and driving power when said signal is in said second state.

* * * * *